(12) United States Patent
Kuranouchi

(10) Patent No.: US 10,511,300 B2
(45) Date of Patent: Dec. 17, 2019

(54) SEMICONDUCTOR DEVICE FOR RADIO FREQUENCY SWITCH, RADIO FREQUENCY SWITCH, AND RADIO FREQUENCY MODULE

(71) Applicant: SONY CORPORATION, Tokyo (JP)

(72) Inventor: Atsushi Kuranouchi, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/502,309

(22) Filed: Jul. 3, 2019

(65) Prior Publication Data

US 2019/0326901 A1 Oct. 24, 2019

Related U.S. Application Data

(63) Continuation of application No. 15/303,072, filed as application No. PCT/JP2015/059125 on Mar. 25, 2015, now Pat. No. 10,374,596.

(30) Foreign Application Priority Data

Apr. 18, 2014 (JP) .................................. 2014-086804

(51) Int. Cl.
*H03K 17/16* (2006.01)
*H01L 29/786* (2006.01)
(Continued)

(52) U.S. Cl.
CPC ....... *H03K 17/161* (2013.01); *H01L 27/1203* (2013.01); *H01L 29/7833* (2013.01);
(Continued)

(58) Field of Classification Search
CPC ................ H03K 17/161; H03K 17/693; H01L 27/1203; H01L 29/7833
(Continued)

(56) References Cited

U.S. PATENT DOCUMENTS 6,010,921 A 1/2000 Soutome
2002/0009859 A1 1/2002 Oh
(Continued)

FOREIGN PATENT DOCUMENTS

CN 101252134 A 8/2008
DE 69800374 T2 3/2001
(Continued)

OTHER PUBLICATIONS

Wolf, et al.,"Highly Resistive Substrate CMOS on SOI for Wireless Front-End Switch Applications", CS Mantech conference, Palm Springs, California, USA, May 16-19, 2011, 04 pages.
(Continued)

*Primary Examiner* — Tomi Skibinski
(74) *Attorney, Agent, or Firm* — Chip Law Group

(57) ABSTRACT

Provided is a semiconductor device for radio frequency switch that includes an SOI substrate and a gate electrode. The SOI substrate includes a buried oxide film and a semiconductor layer on a carrier substrate. The gate electrode is provided on the semiconductor layer. The semiconductor layer includes a first area below the gate electrode and a second area other than the first area. A third area is provided in at least part of the second area. A fourth area is provided in at least part of the first area. The fourth area has a different thickness from a thickness of the third area.

21 Claims, 29 Drawing Sheets

(51) Int. Cl.
*H01L 29/78* (2006.01)
*H01L 27/12* (2006.01)
*H03K 17/693* (2006.01)

(52) U.S. Cl.
CPC .. *H01L 29/78621* (2013.01); *H01L 29/78654* (2013.01); *H01L 29/78696* (2013.01); *H03K 17/693* (2013.01)

(58) Field of Classification Search
USPC .......... 327/382, 564–566; 257/347, E29.273
See application file for complete search history.

(56) References Cited

U.S. PATENT DOCUMENTS

| | | | |
|---|---|---|---|
| 2002/0145156 | A1 | 10/2002 | Igarashi et al. |
| 2008/0203477 | A1* | 8/2008 | Yamazaki ............. H01L 27/105 257/347 |

FOREIGN PATENT DOCUMENTS

| | | |
|---|---|---|
| EP | 0880169 A1 | 11/1998 |
| JP | 11-040817 A | 2/1999 |
| JP | 2002-033490 A | 1/2002 |
| JP | 2008-182165 A | 8/2008 |
| JP | 2008-235876 A | 10/2008 |
| JP | 2009-016469 A | 1/2009 |
| JP | 2011-071529 A | 4/2011 |
| JP | 2011-171623 A | 9/2011 |
| KR | 10-2002-0003028 A | 1/2002 |
| TW | 396635 B | 7/2000 |
| TW | 501275 B | 9/2002 |

OTHER PUBLICATIONS

Tinella, et al., "0.13/spl mu/m CMOS SOI SP6T antenna switch for multi-standard handsets", Digest of Papers. 2006 Topical Meeting on Silicon Monolithic Integrated Circuits in RF Systems, IEEE, 2006, pp. 58-61.
Non-Final Office Action for U.S. Appl. No. 15/303,072, dated Dec. 3, 2018, 16 pages.
Notice of Allowance for U.S. Appl. No. 15/303,072, dated Mar. 26, 2019, 11 pages.
International Preliminary Report on Patentability of PCT Application No. PCT/JP2015/059125, dated Oct. 18, 2016, 10 pages of English Translation and 05 pages of IPRP.
International Search Report and Written Opinion of PCT Application No. PCT/JP2015/059125, dated Jun. 16, 2016, 12 pages of English Translation and 09 pages of ISRWO.
Tinella, et al., "0.13μm CMOS SOI SP6T Antenna Switch for Multi-Standard Handsets", Digest of Papers, 2006 Topical Meeting on Silicon Monolithic Integrated Circuits in RF Systems, Jan. 18-20, 2006, pp. 58-61.

* cited by examiner

[FIG. 1]
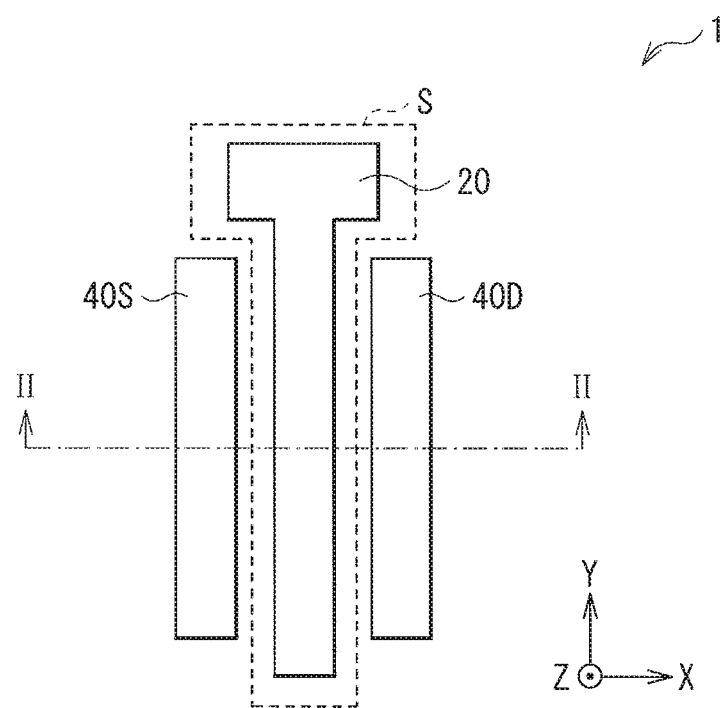

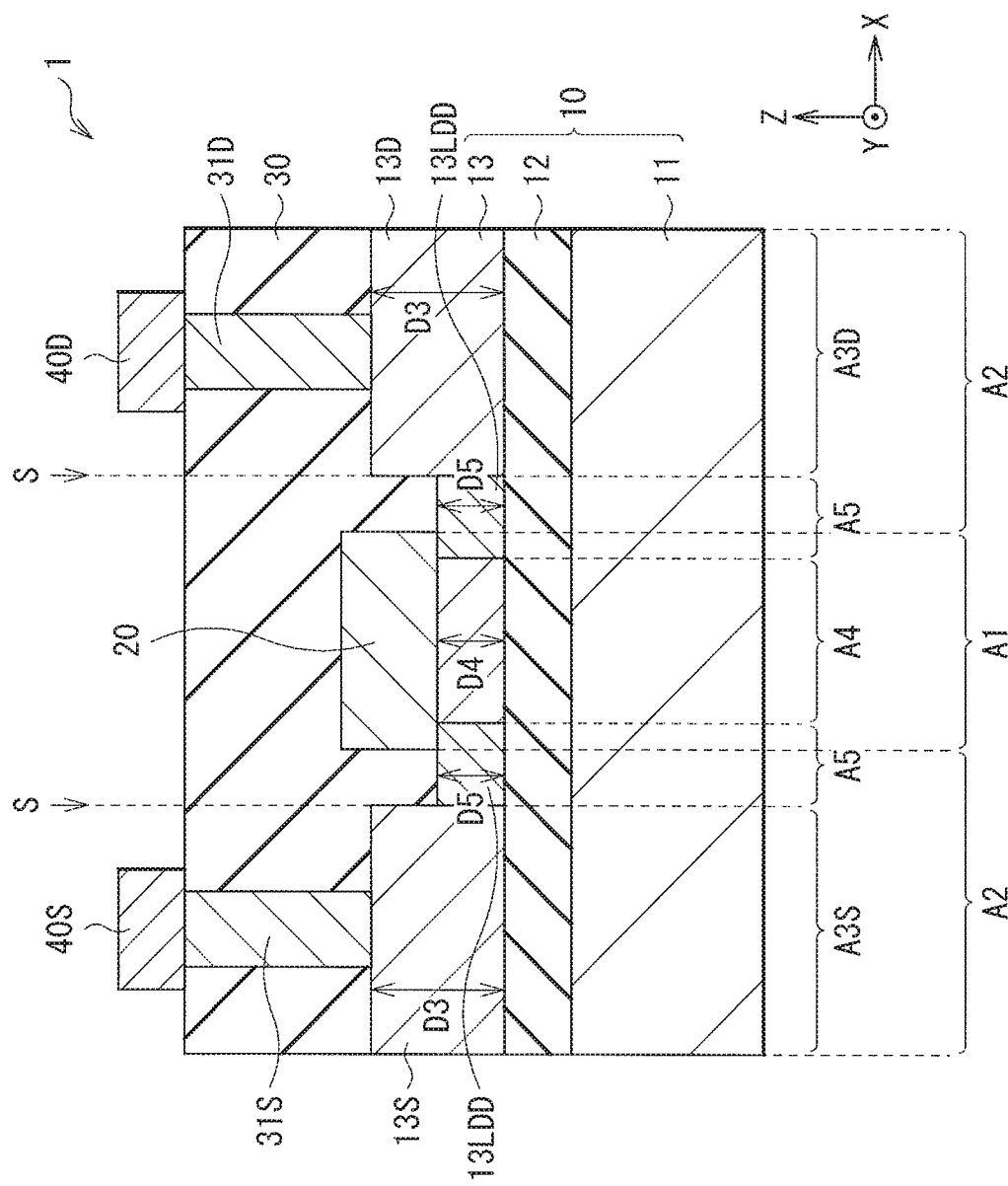
[FIG. 2]

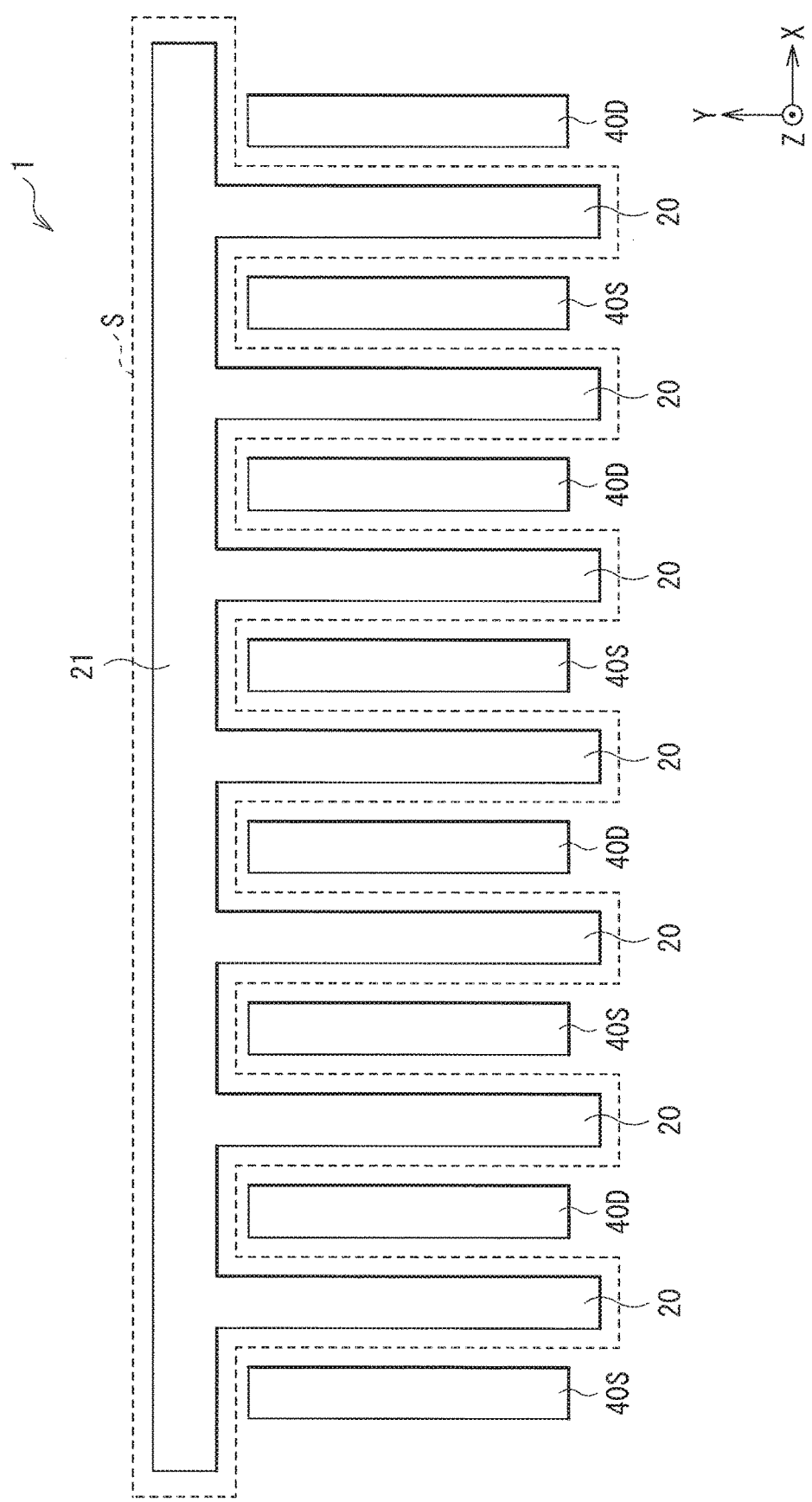

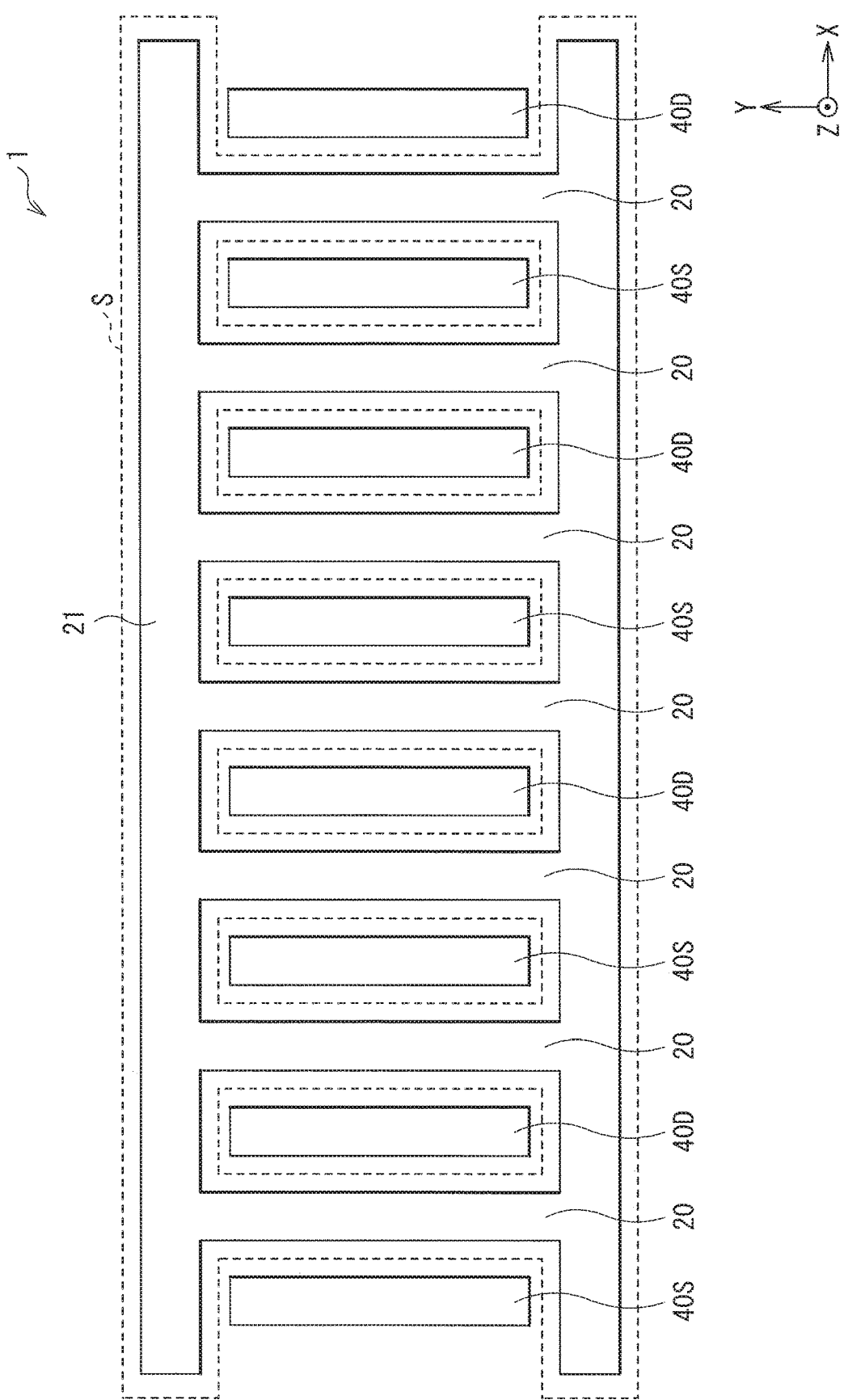

[FIG. 5]
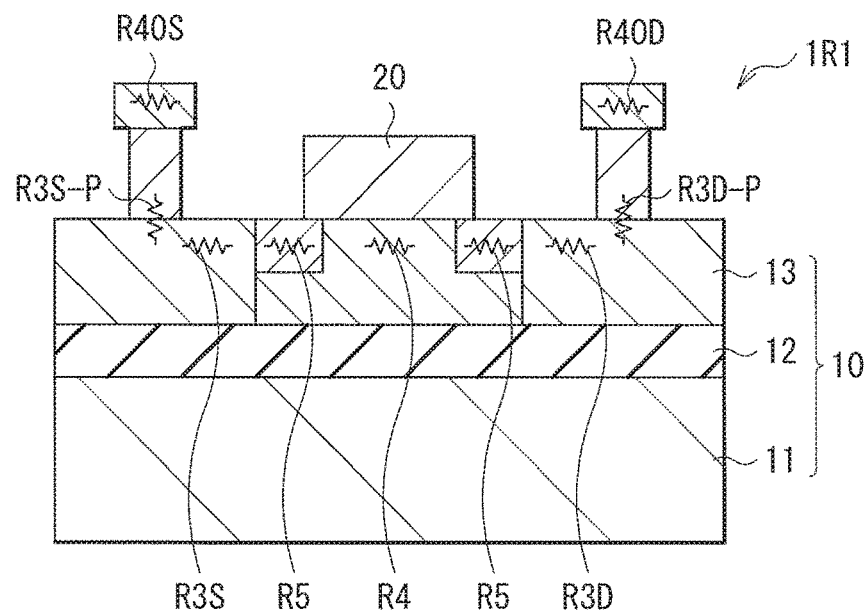
[FIG. 6]
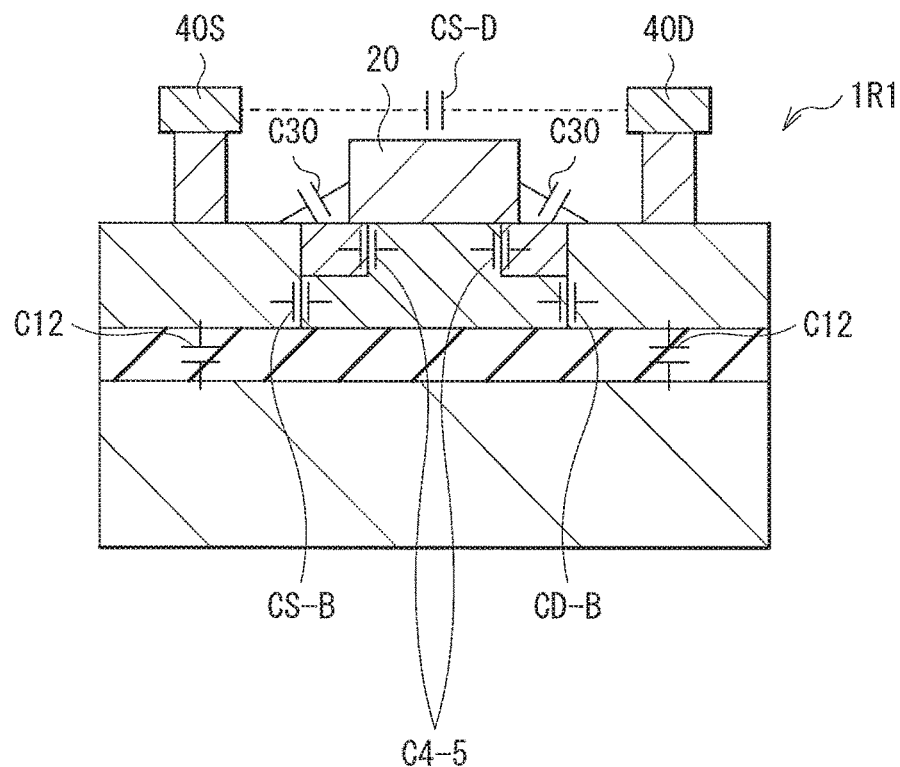

[FIG. 7]
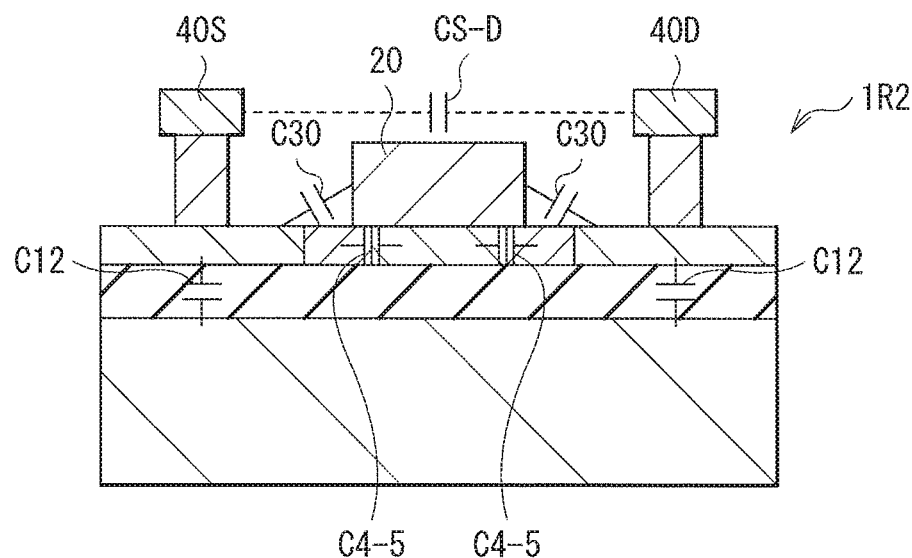
[FIG. 8]
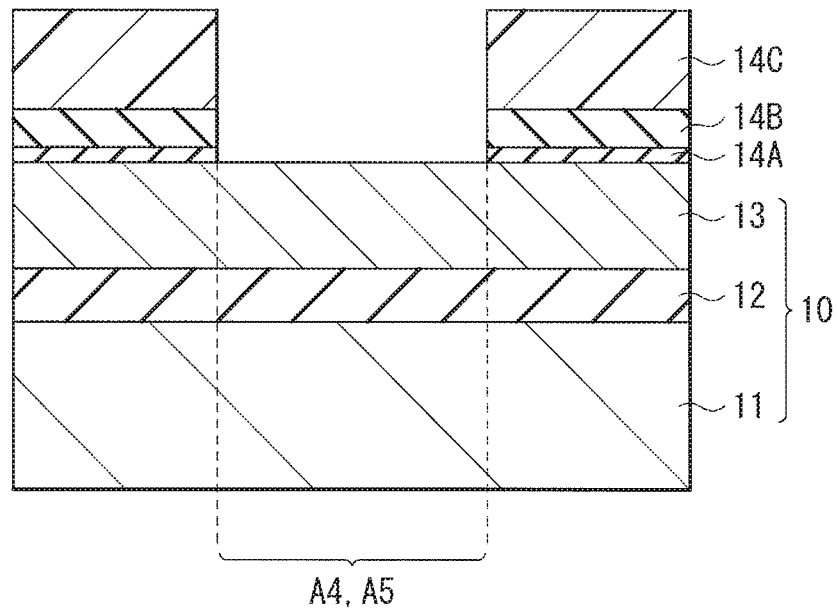

[FIG. 9]
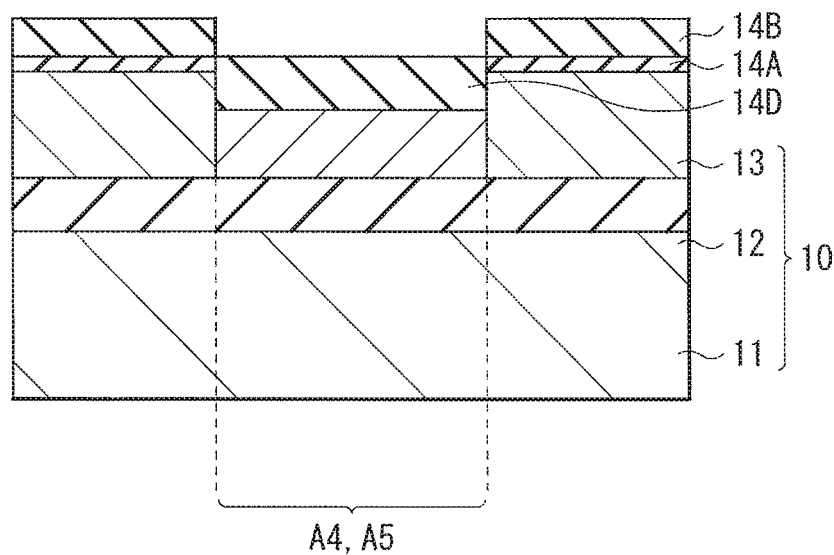
[FIG. 10]
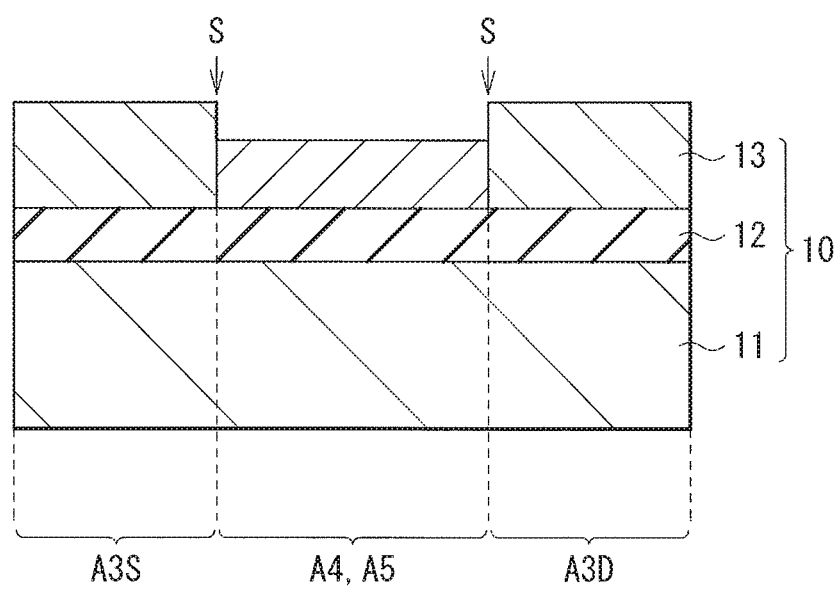

[FIG. 11]
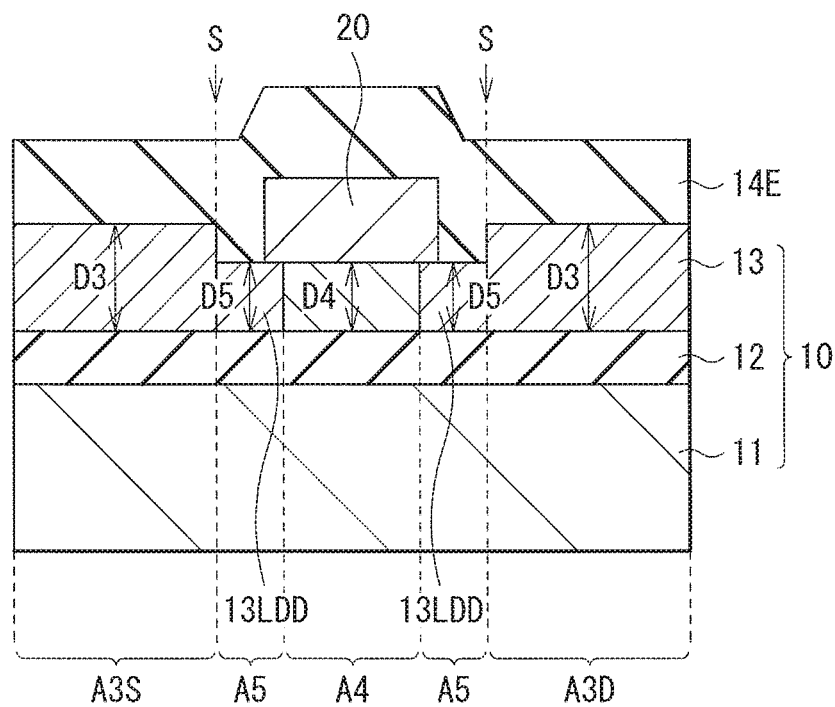
[FIG. 12]
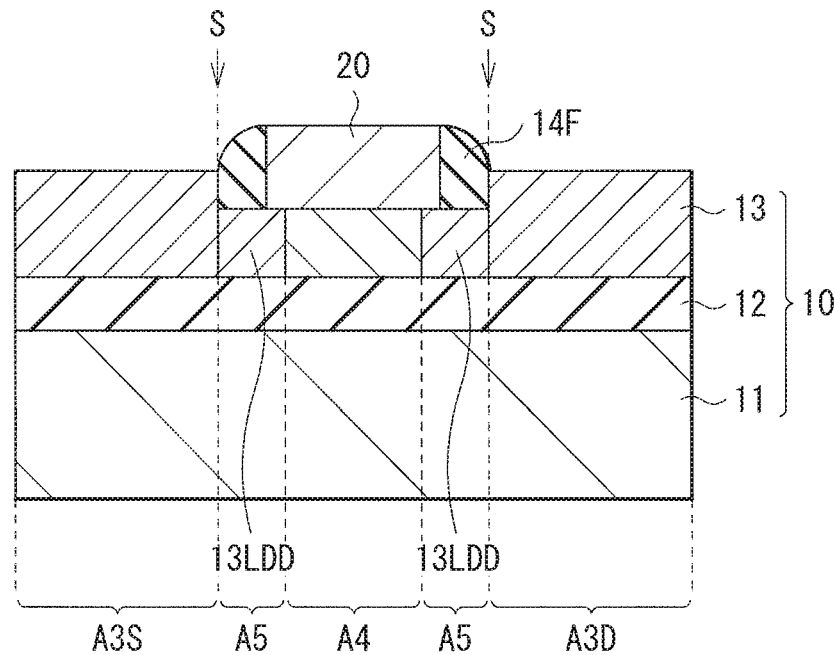

[ FIG. 13 ]
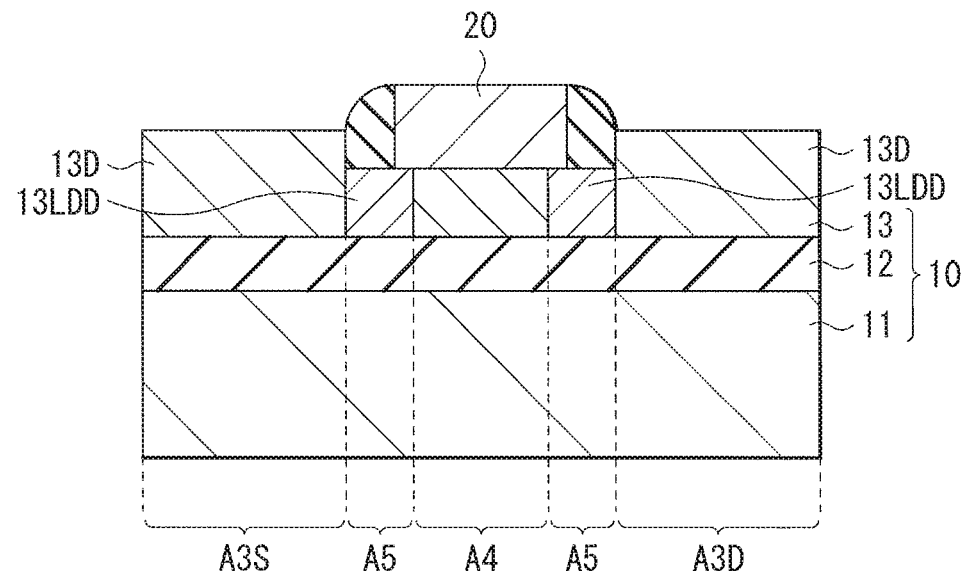
[ FIG. 14 ]
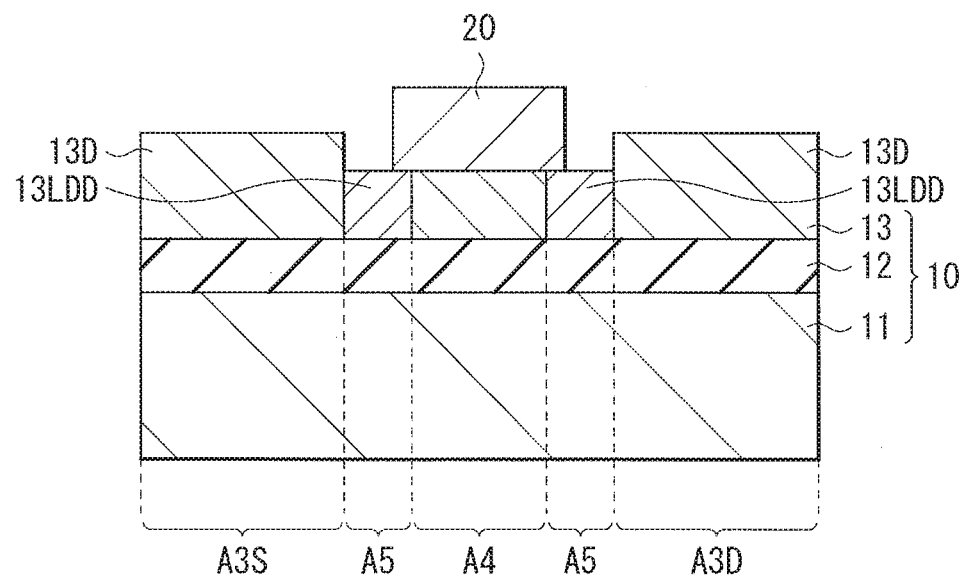

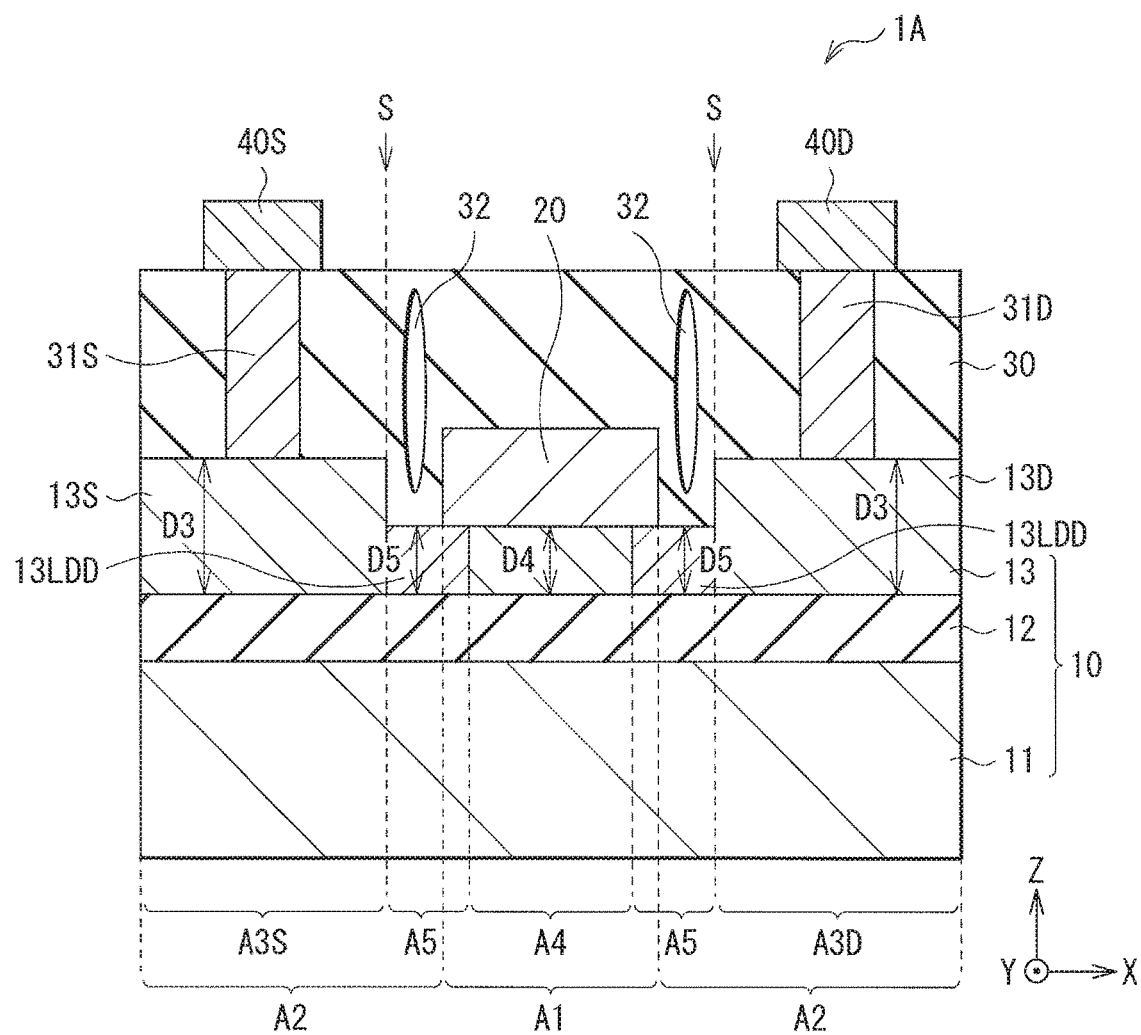
[FIG. 15]

[FIG. 16]
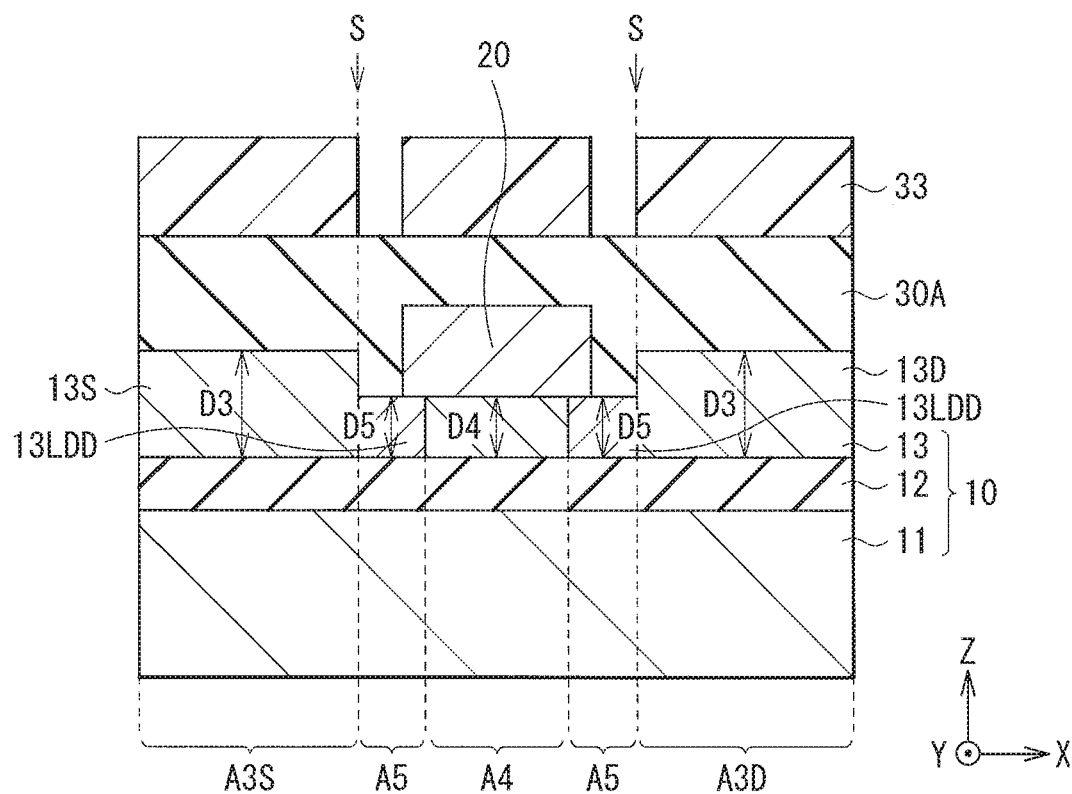
[FIG. 17]
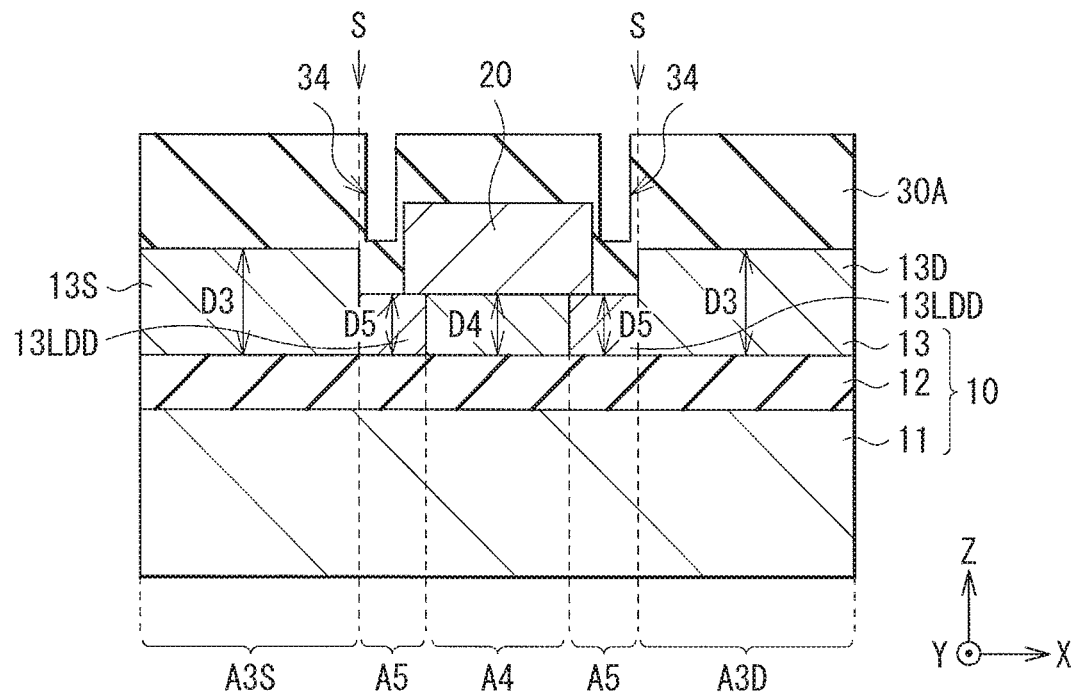

[ FIG. 18 ]
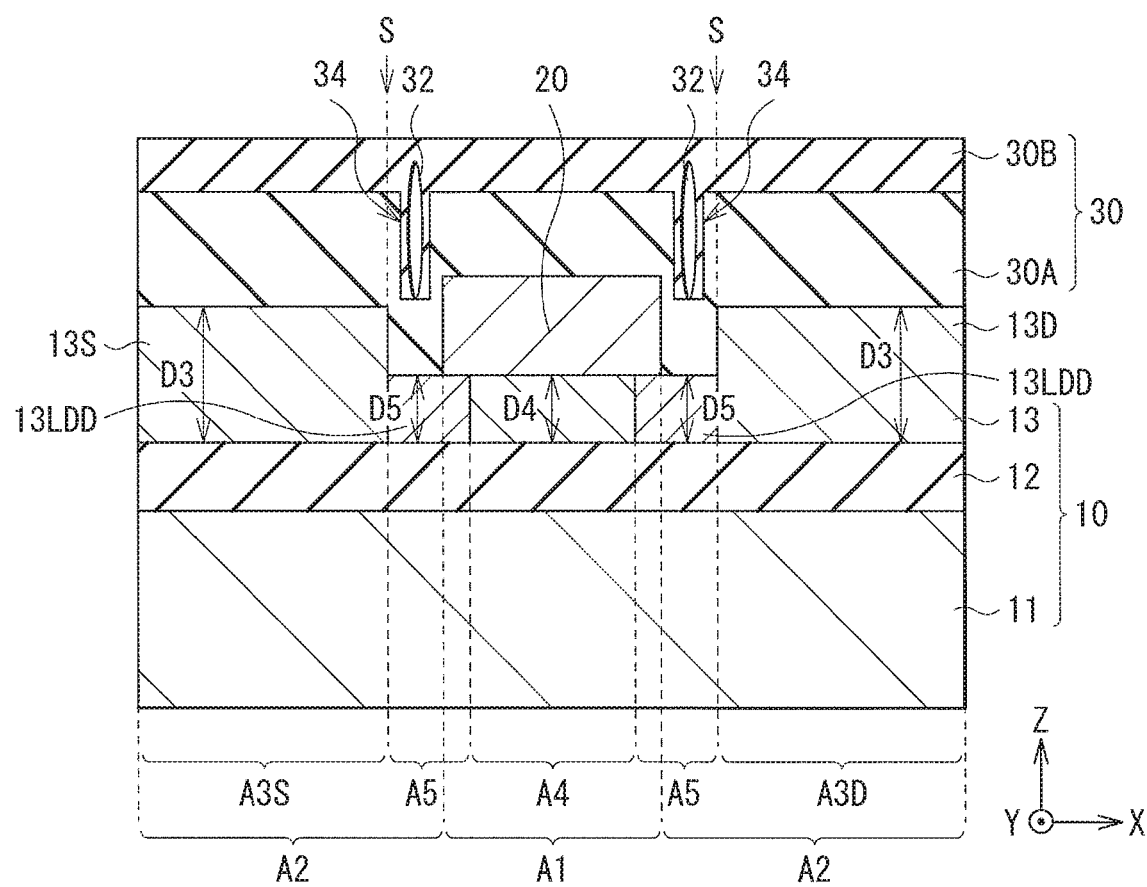

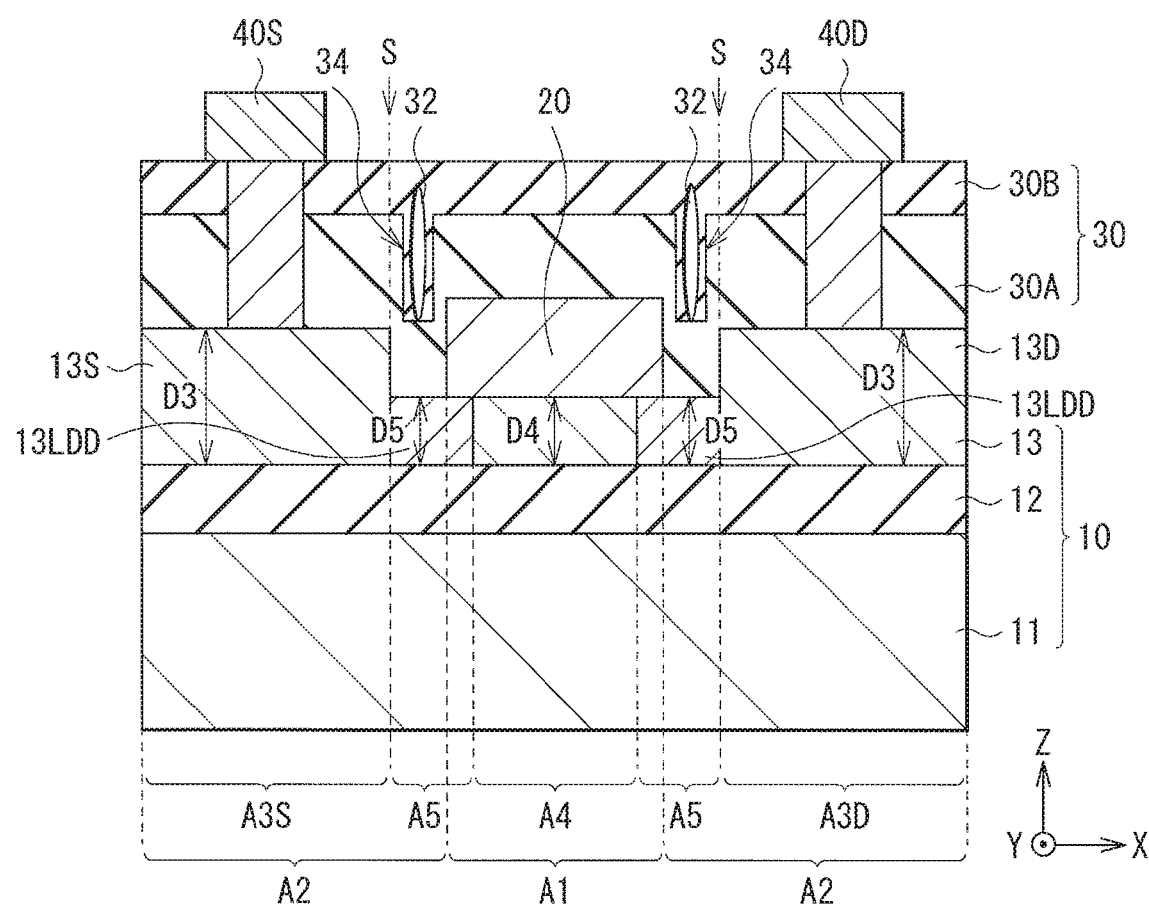
[FIG. 19]

[ FIG. 20 ]
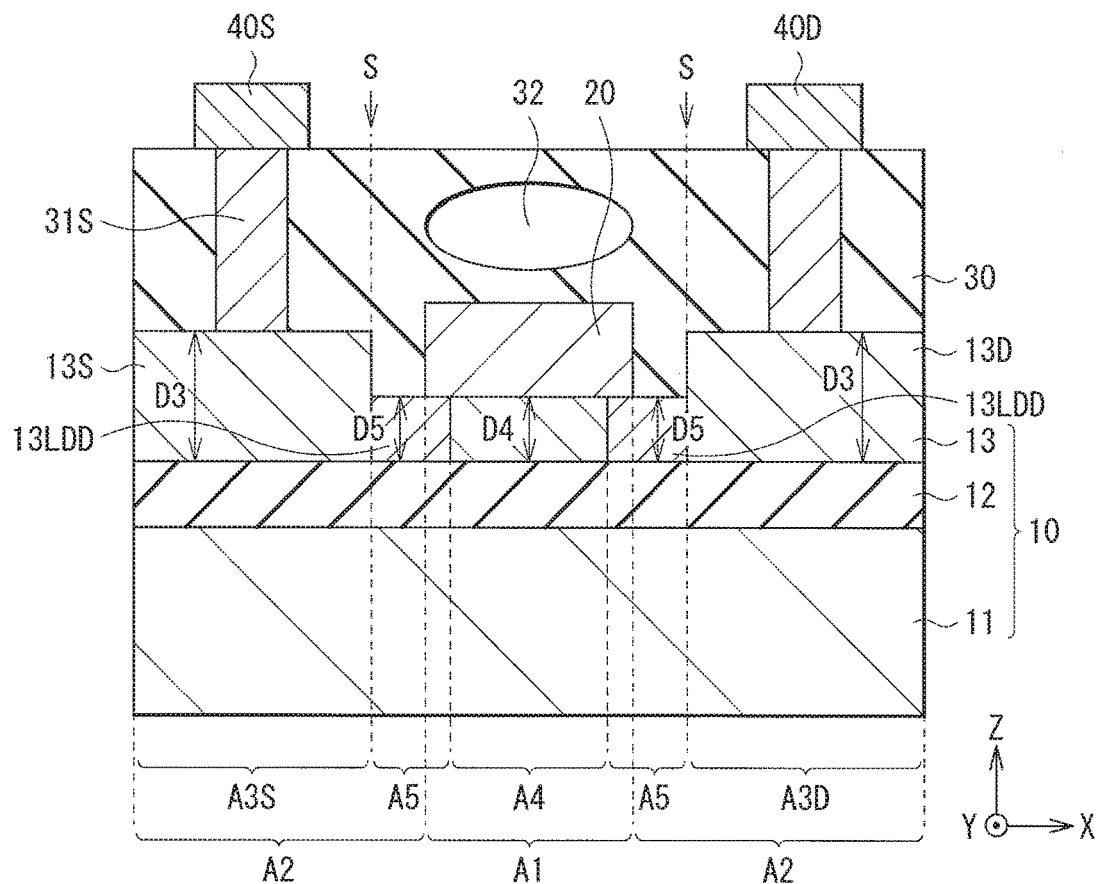
[ FIG. 21 ]
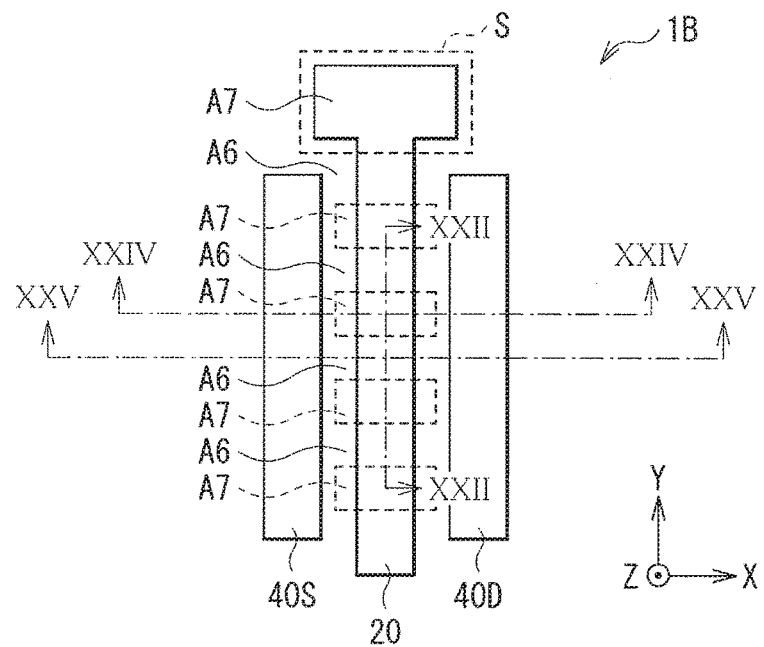

[ FIG. 22 ]
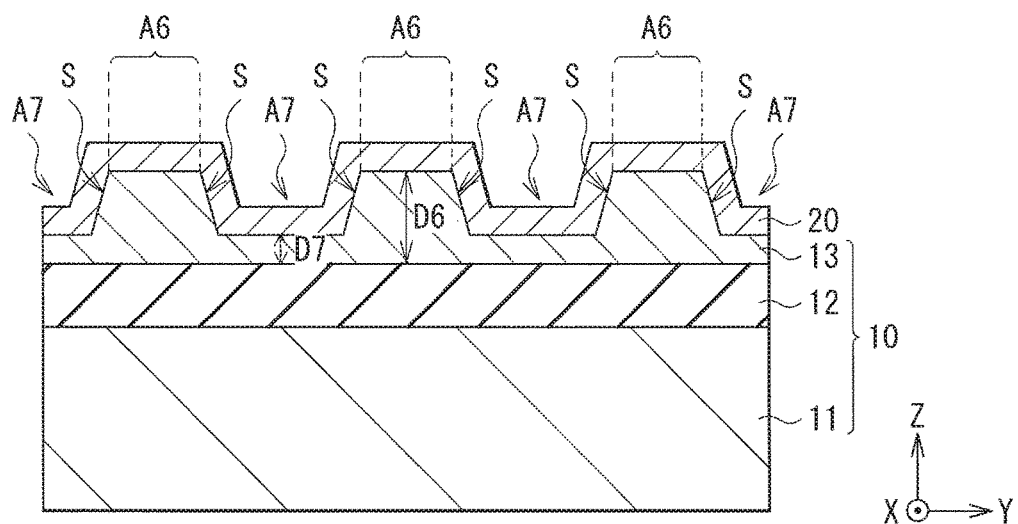
[ FIG. 23 ]
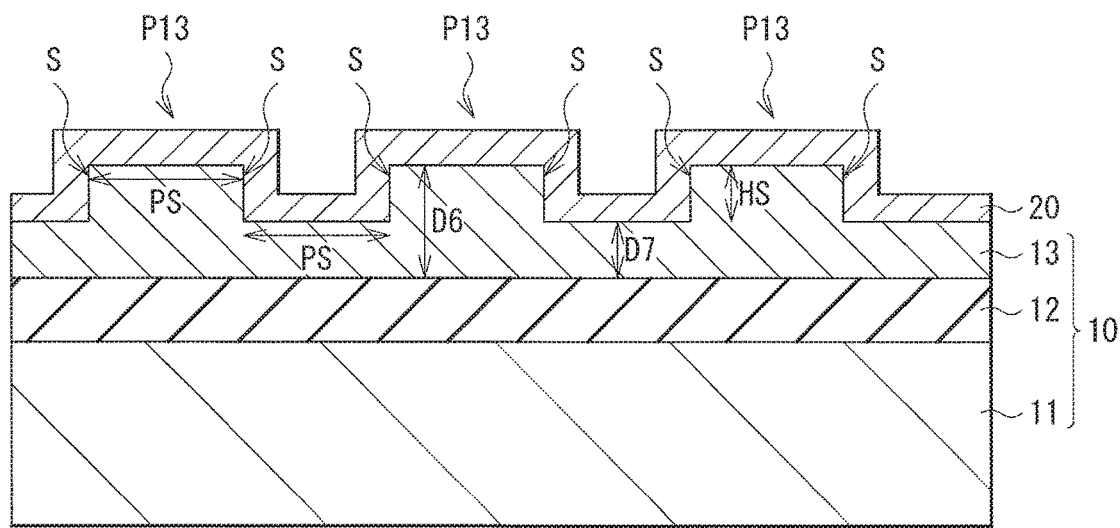

[ FIG. 24 ]
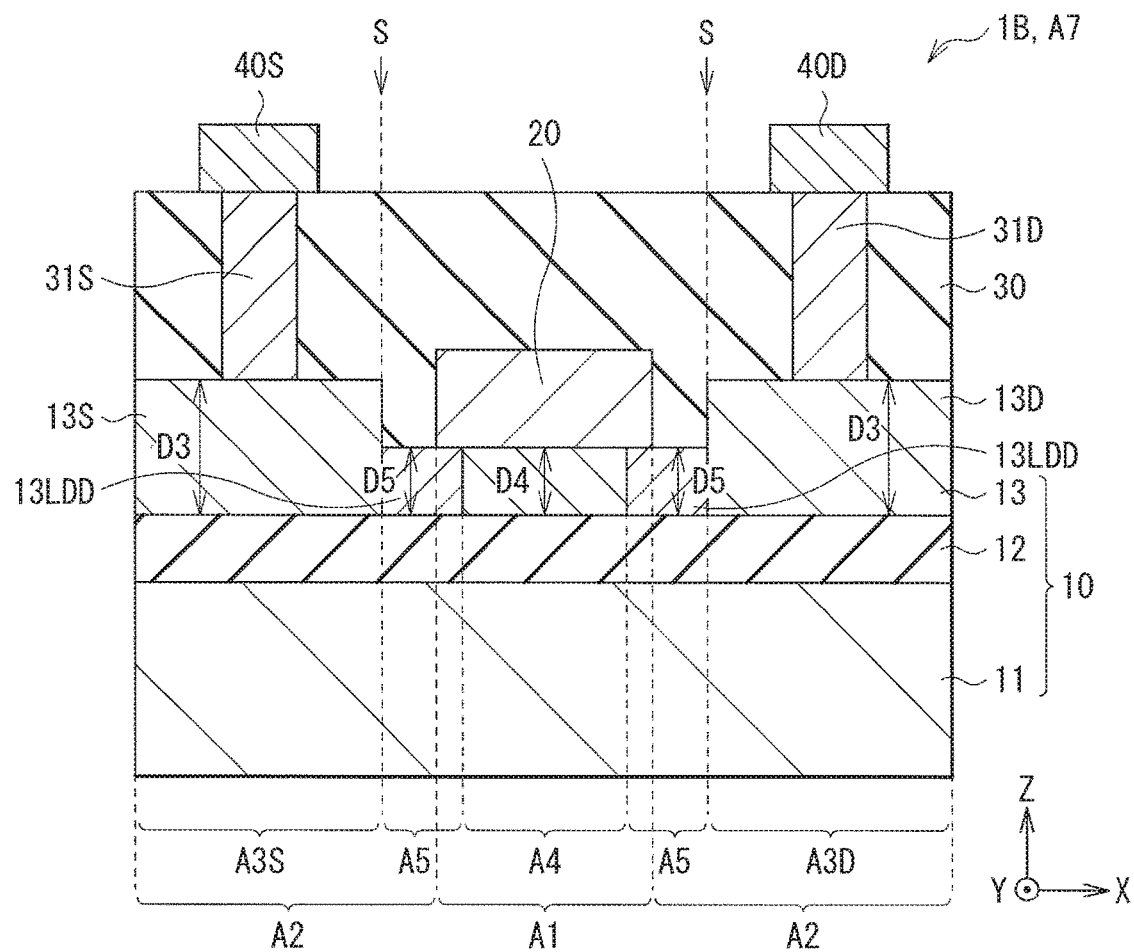

[FIG. 25]
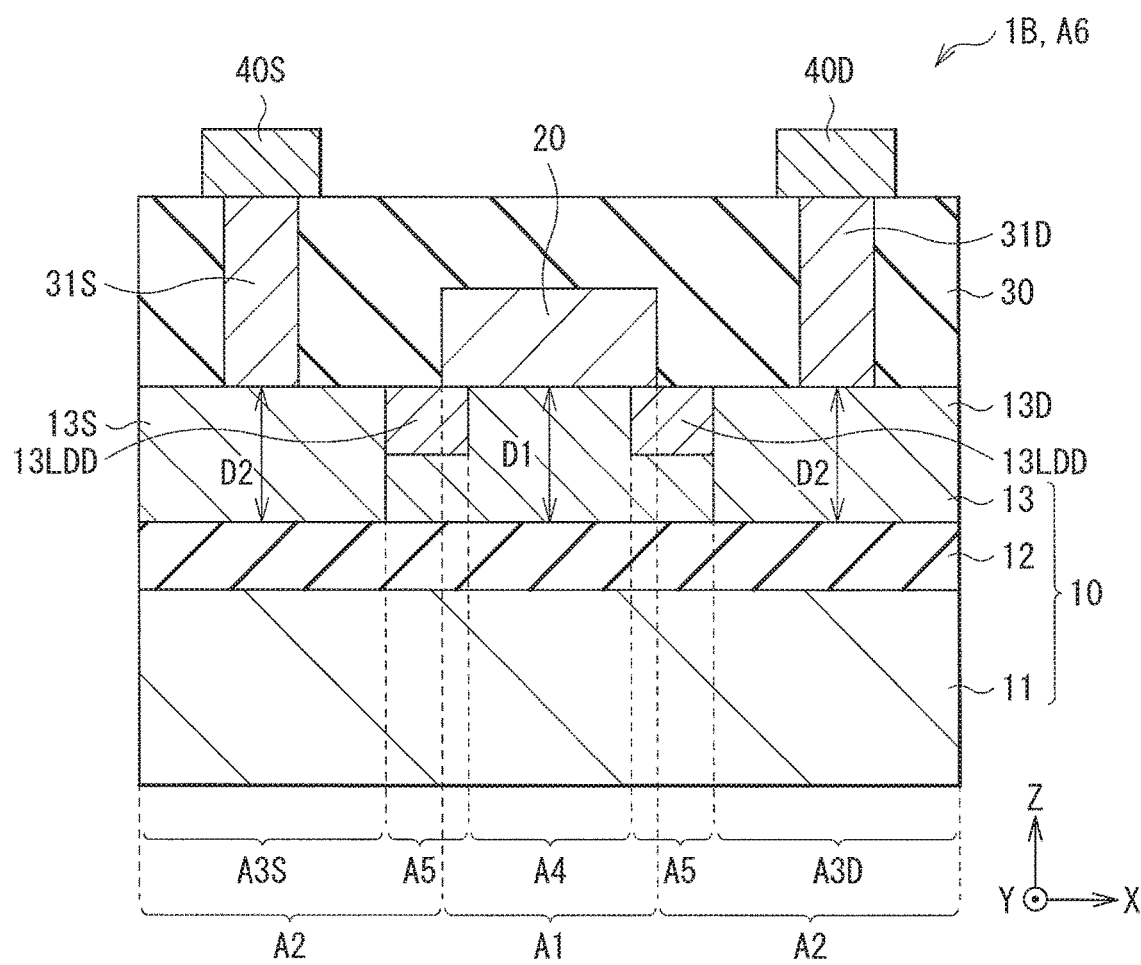

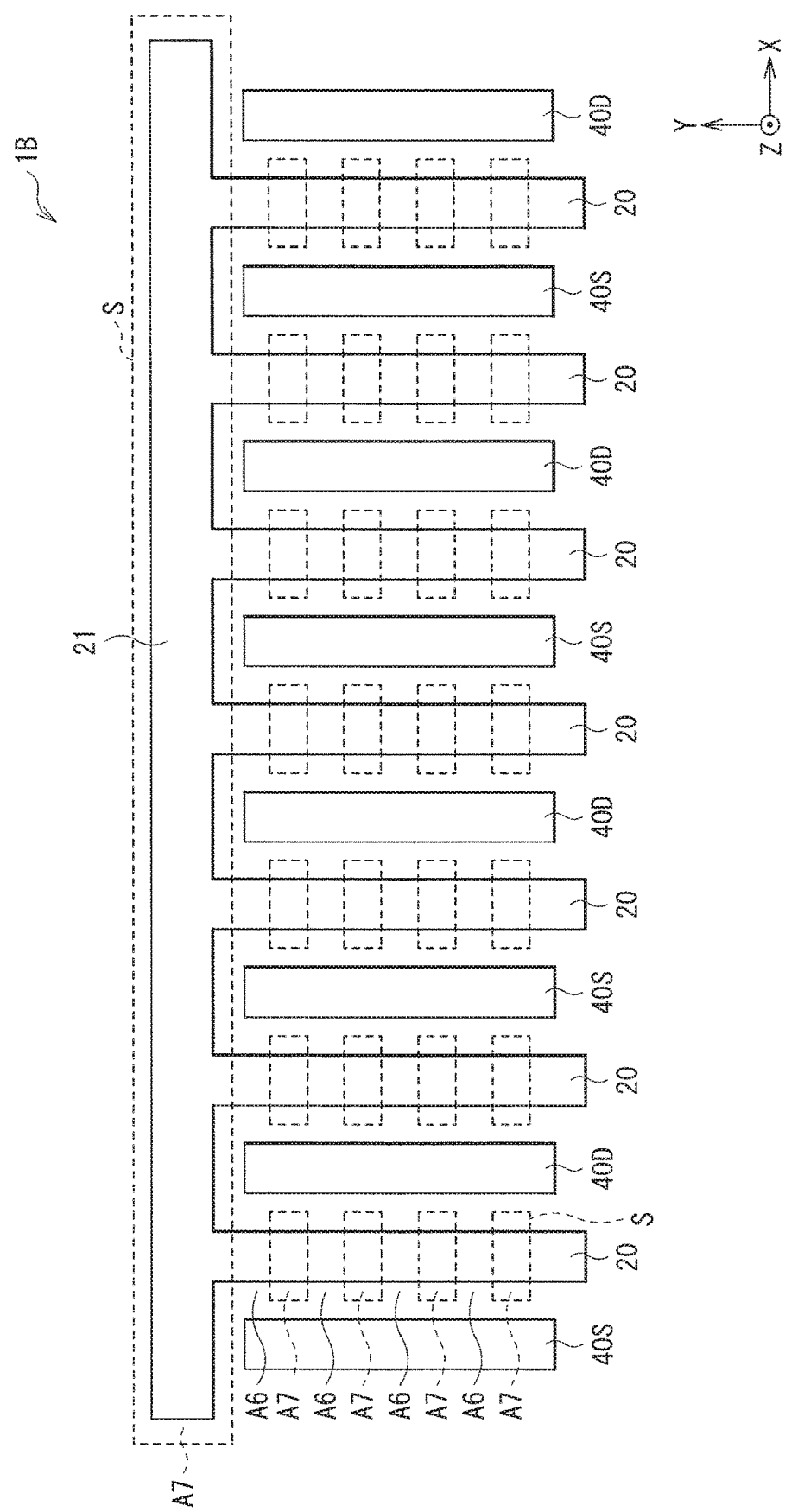
[FIG. 26]

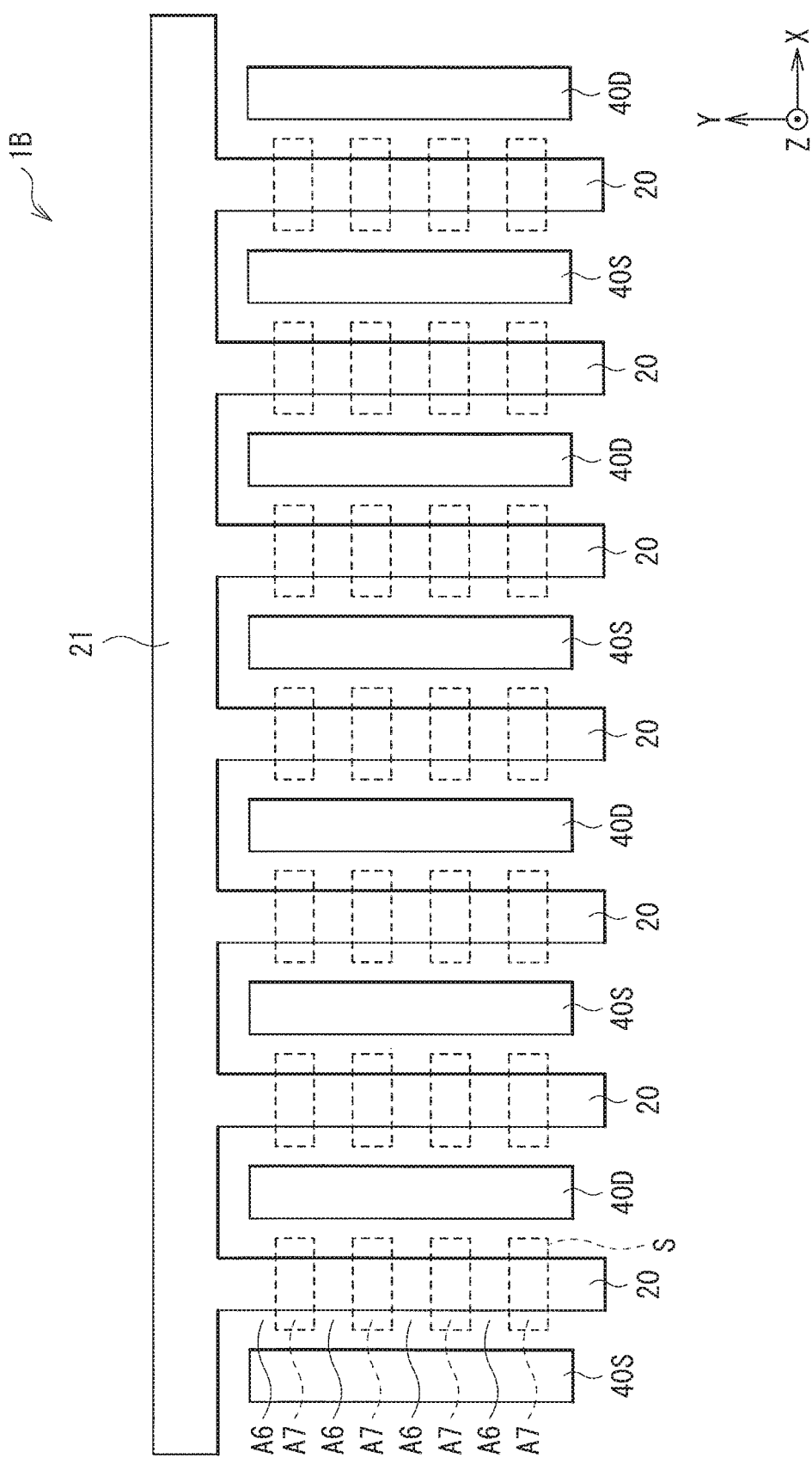
[FIG. 27]

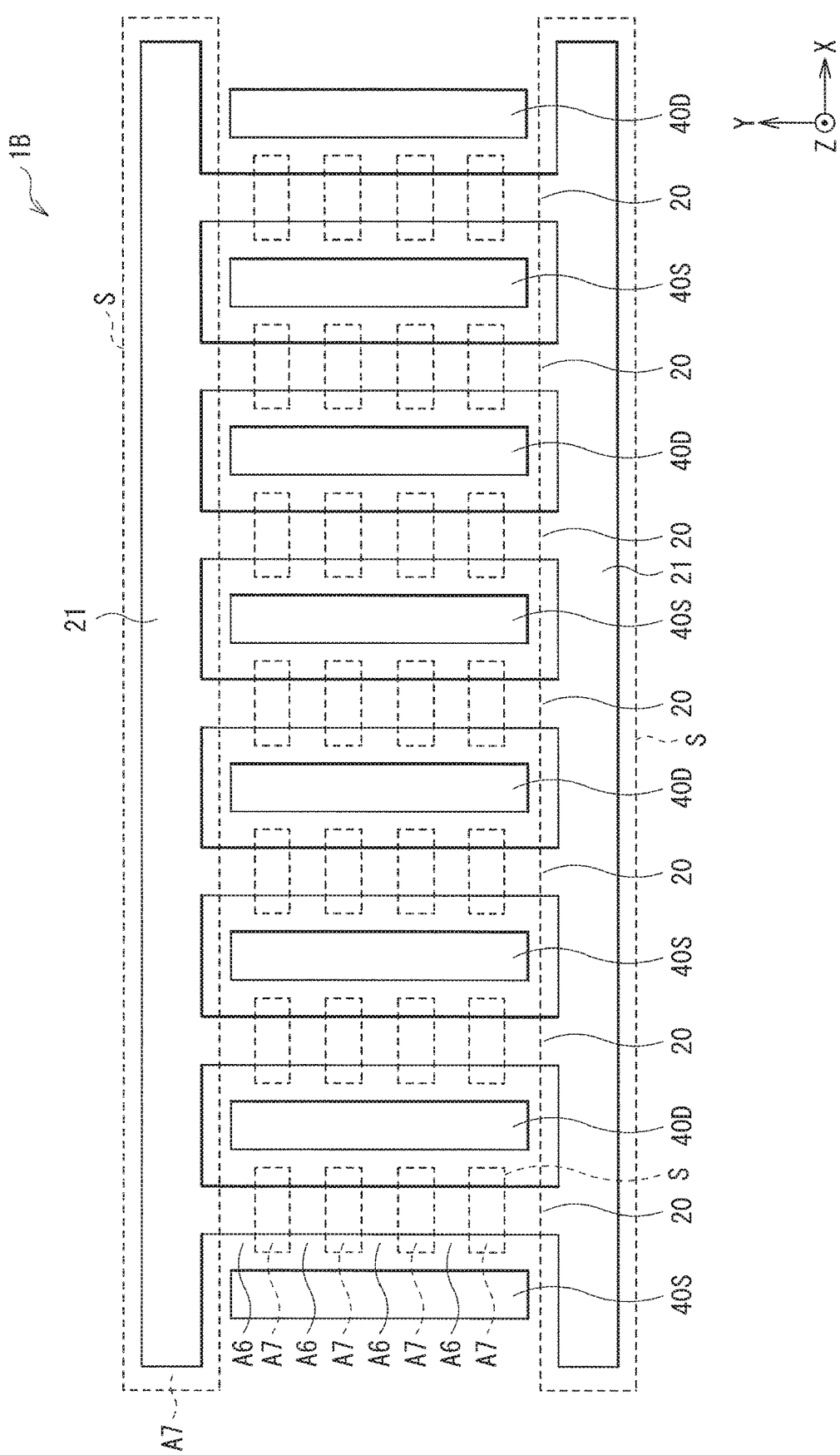
[FIG. 28]

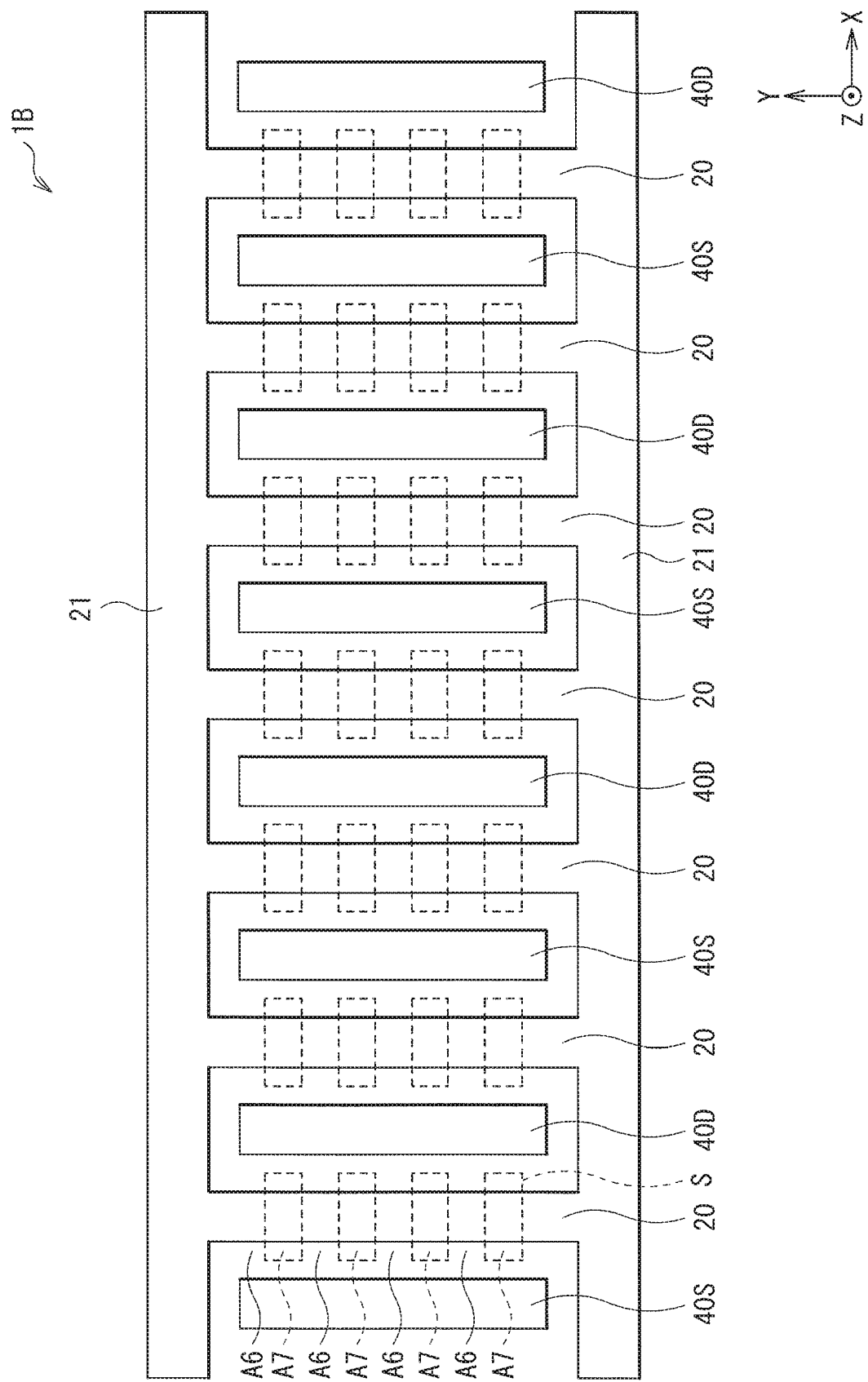

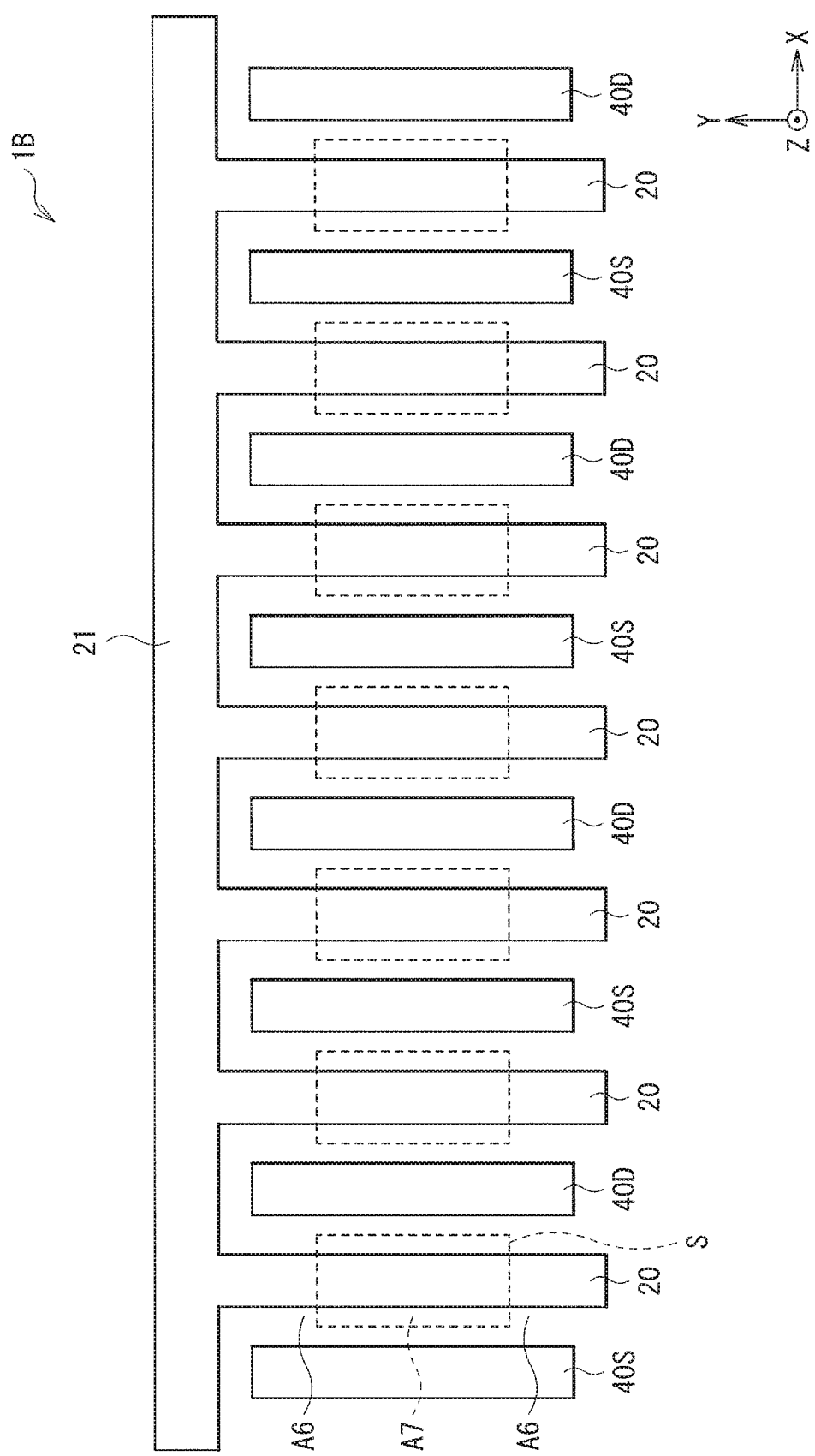
[FIG. 30]

[FIG. 31]
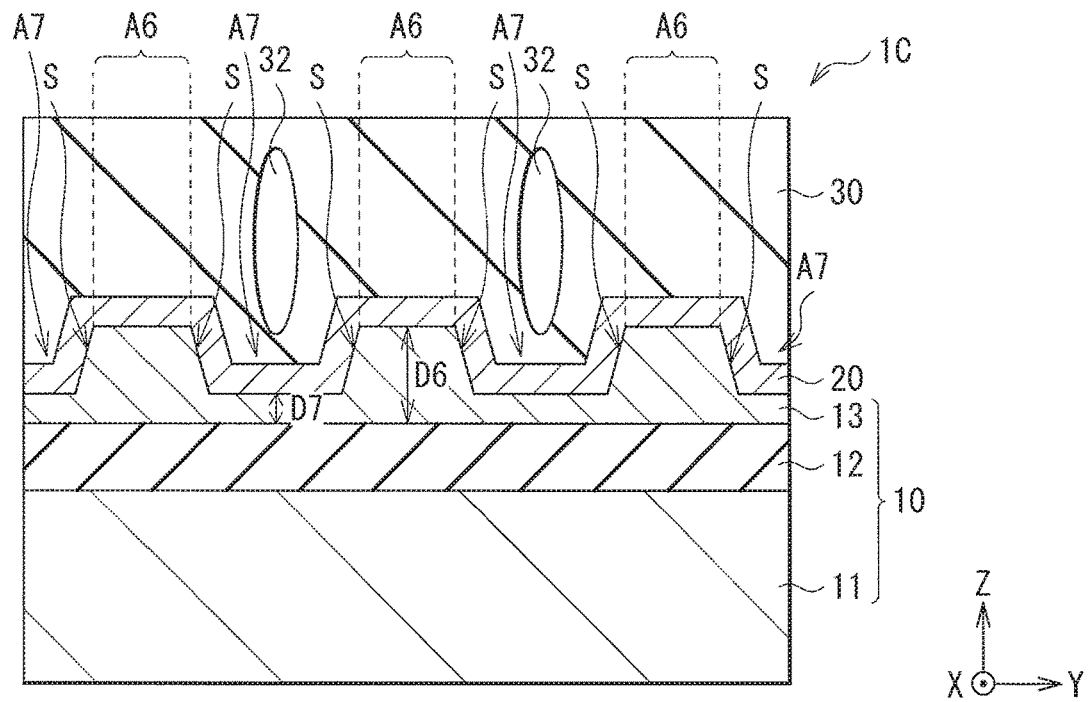
[FIG. 32]
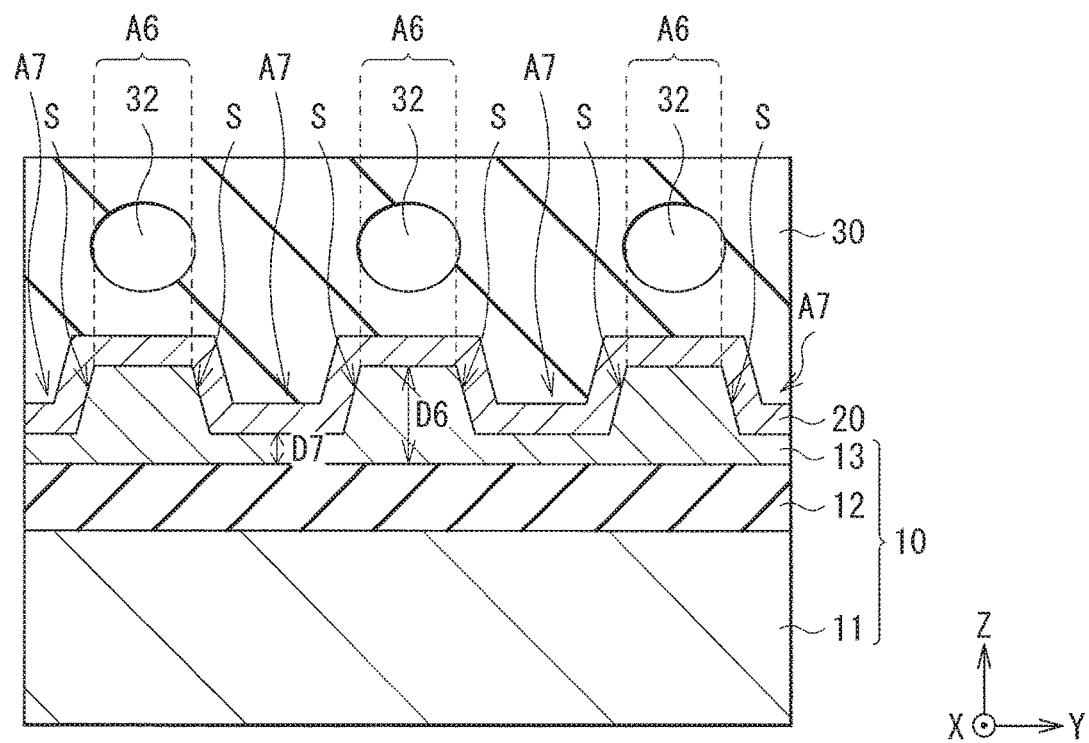

[FIG. 33]
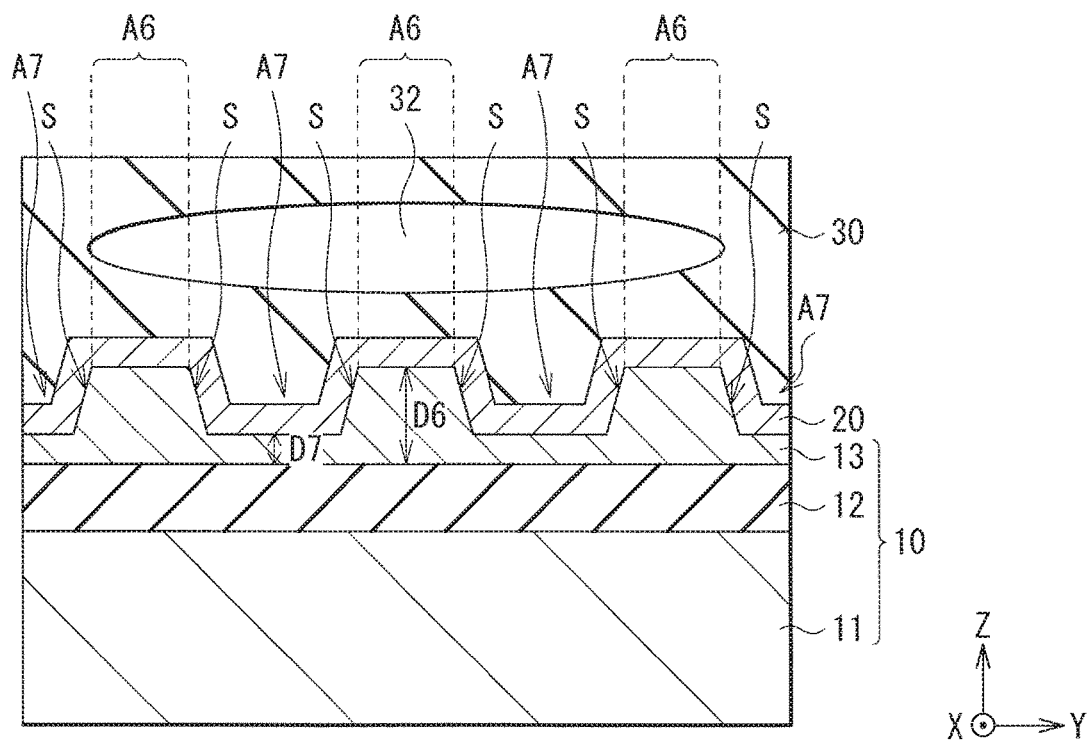
[FIG. 34]
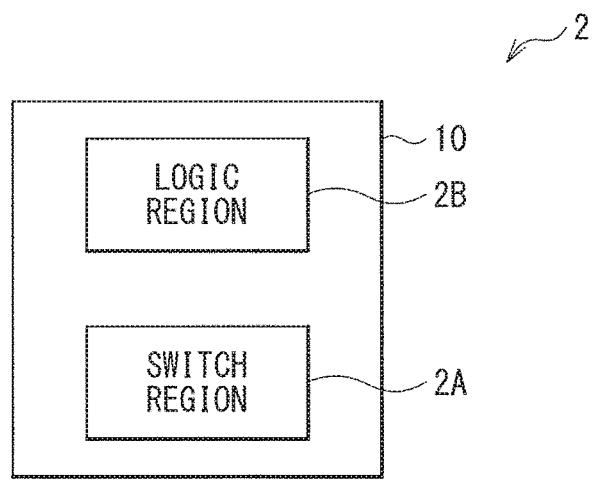

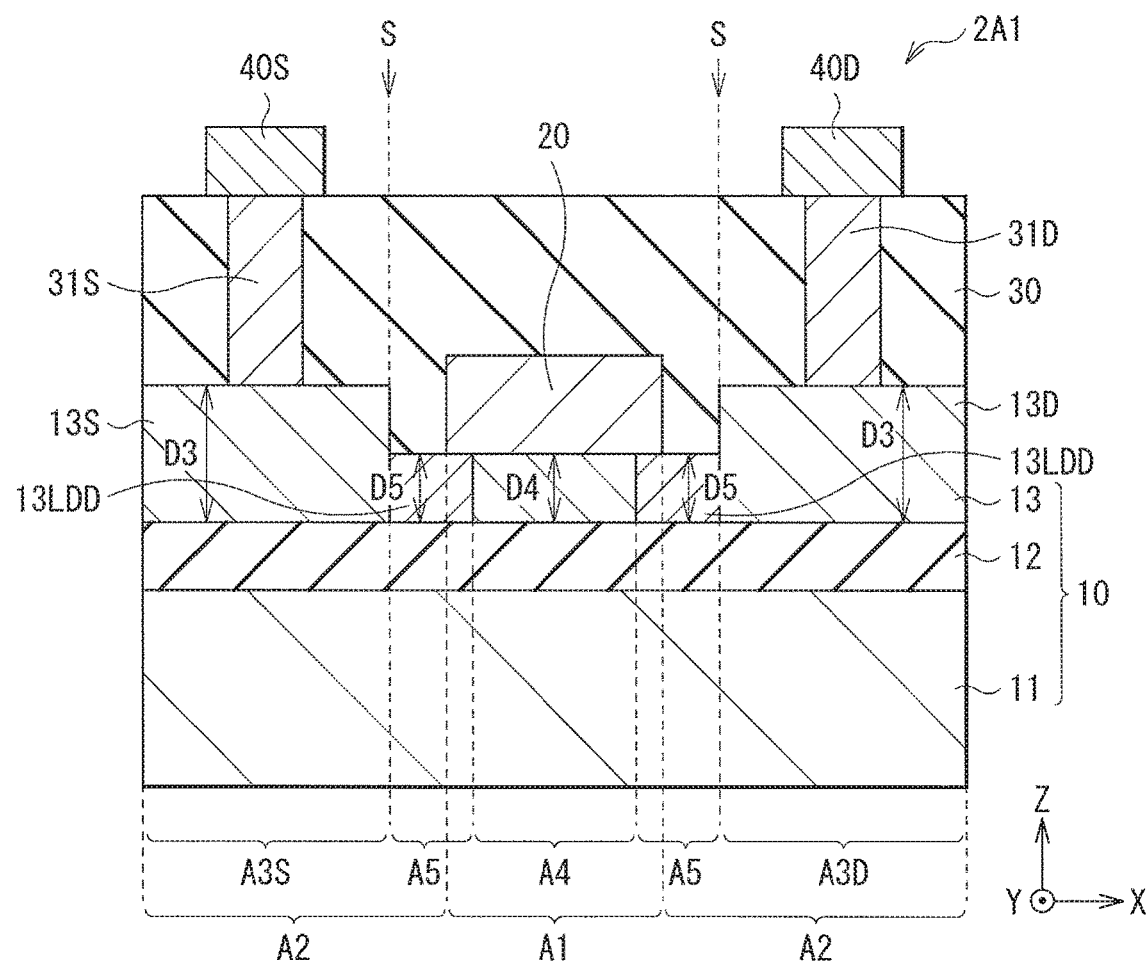
[FIG. 35]

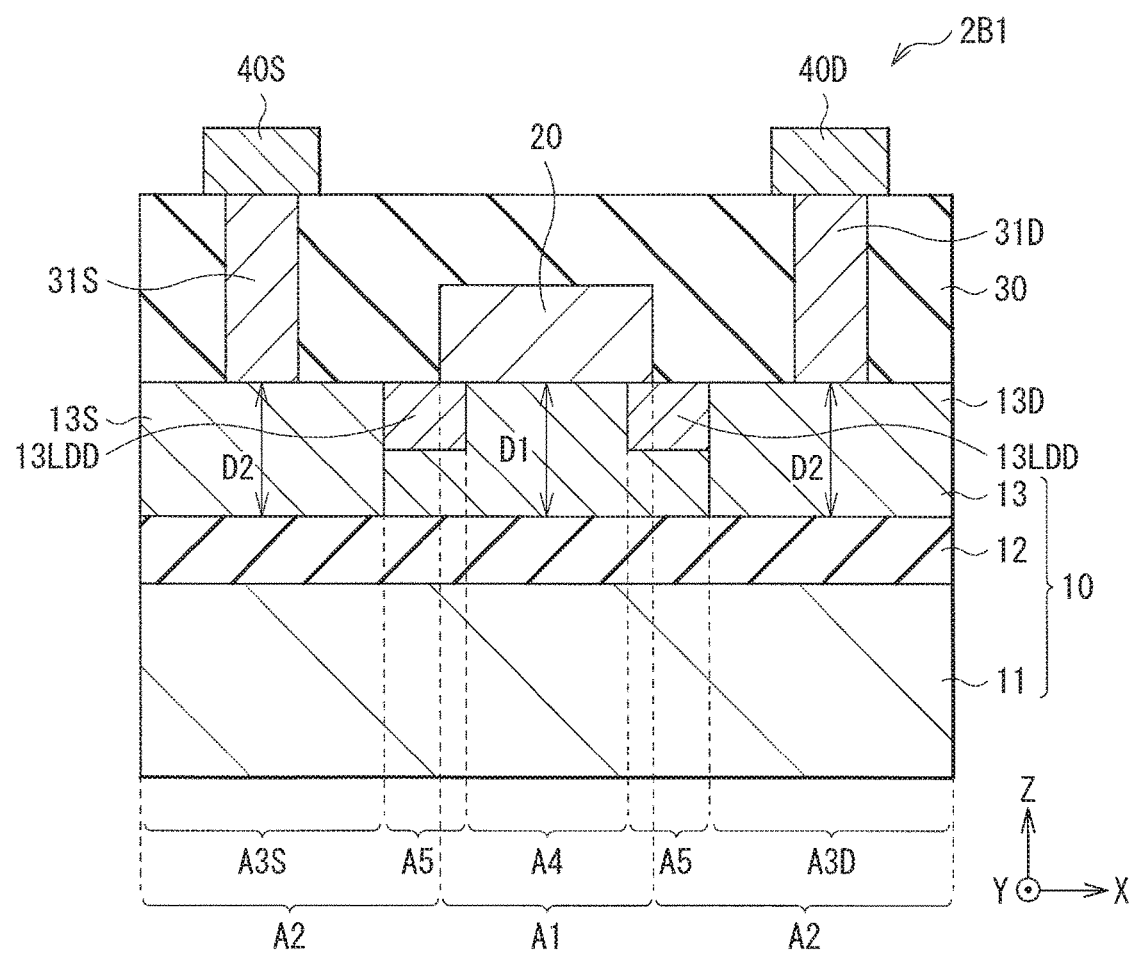
[FIG. 36]

[ FIG. 37 ]
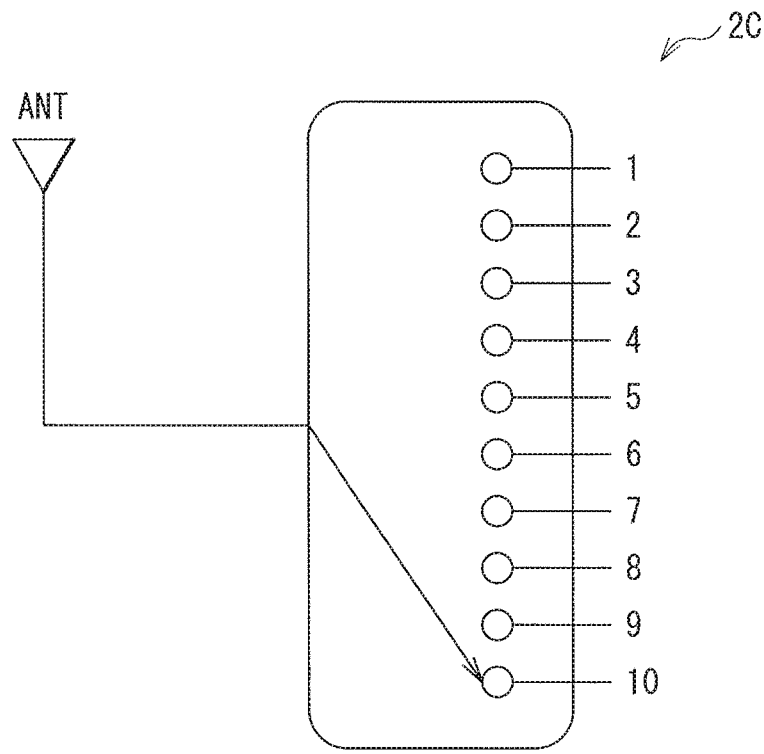
[ FIG. 38 ]
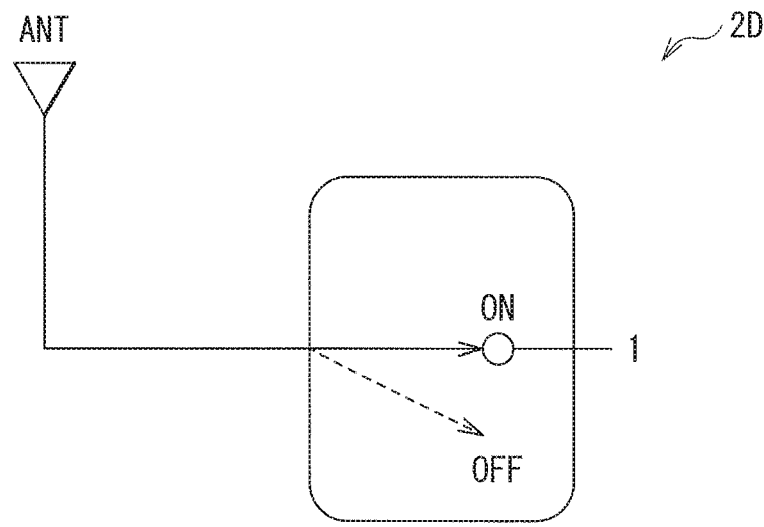

[ FIG. 39 ]
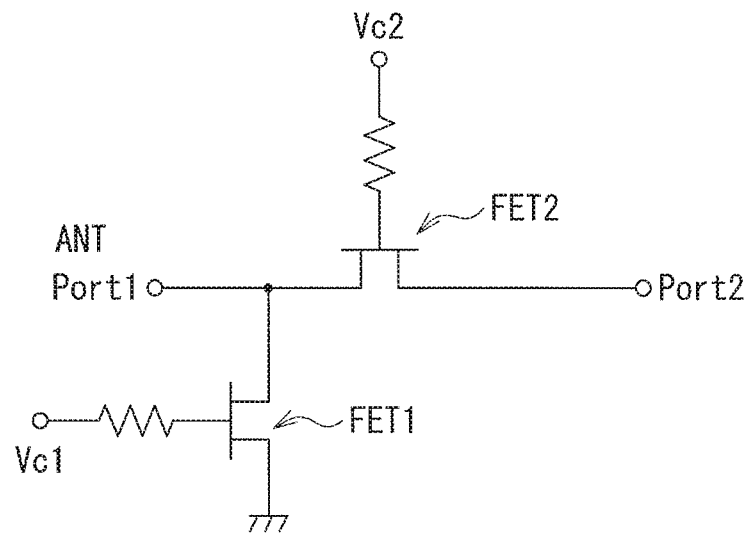
[ FIG. 40 ]
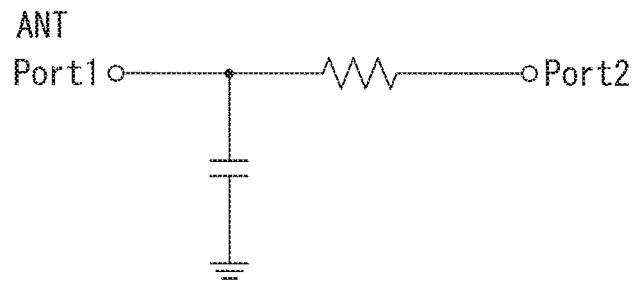
[ FIG. 41 ]
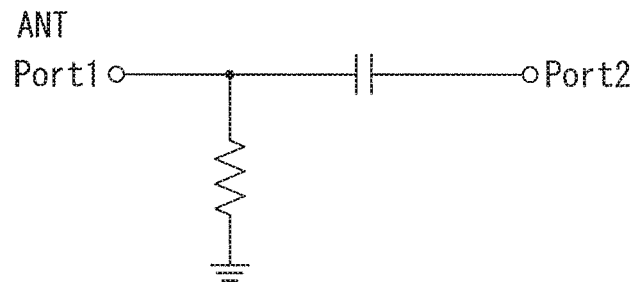

[ FIG. 42 ]
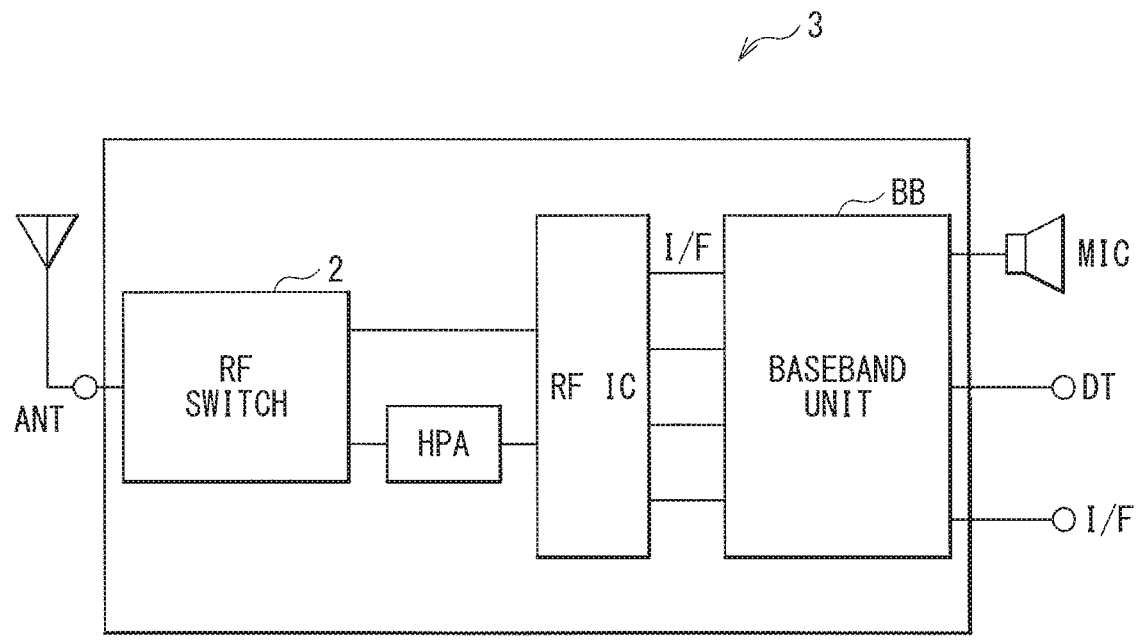

SEMICONDUCTOR DEVICE FOR RADIO FREQUENCY SWITCH, RADIO FREQUENCY SWITCH, AND RADIO FREQUENCY MODULE

CROSS REFERENCE TO RELATED APPLICATIONS

The present application claims priority from U.S. patent application Ser. No. 15/303,072, filed on Oct. 10, 2016, which is a U.S. National Phase of International Patent Application No. PCT/JP2015/059125 filed on Mar. 25, 2015, which claims priority benefit of Japanese Patent Application No. JP 2014-086804 filed in the Japan Patent Office on Apr. 18, 2014. Each of the above-referenced applications is hereby incorporated herein by reference in its entirety.

TECHNICAL FIELD

The disclosure relates to a semiconductor device for radio frequency (RF) switch used in, for example, an antenna or a power amplifier (PA), a radio frequency switch including the semiconductor device for radio frequency switch, and a radio frequency module including the radio frequency switch.

BACKGROUND ART

A front end of a mobile communication terminal device, e.g., a mobile phone, may be provided with a radio frequency switch (RF-SW) that may turn on and off radio frequency (RF). So far, the radio frequency switch has utilized compound-based (e.g., GaAs-based) field effect transistors (FETs) as its switching elements. But recently, FETs using SOI substrates have been also increasing (for example, refer to Non-patent Literature 1 and Non-patent Literature 2).

CITATION LIST

Non-Patent Literature

Non-patent Literature 1: Randy Wolf, et al., "Highly Resistive Substrate CMOS on SOI for Wireless Front-End Switch Applications", CS MANTECH, 2011
Non-patent Literature 2: C. Tinella, et al., "0.13 µm CMOS SOI SP6T Antenna Switch for Multi-Standard Handsets", SiRF, 2006

SUMMARY OF INVENTION

Important characteristics of the radio frequency switch may be exemplified by insertion loss and isolation. The insertion loss may be related to a condition in which a signal from an antenna or a PA is allowed to be passed through with small loss. The isolation may be related to a condition in which little signal leakage into peripheral circuits occurs. To enhance these, a technique has been pursued to reduce a product (Ron*Coff) of FET resistance in an ON state (ON resistance) and FET capacitance in an OFF state (OFF capacitance).

It is therefore desirable to provide a semiconductor device for radio frequency switch that makes it possible to reduce a product (Ron*Coff) of ON resistance and OFF capacitance, a radio frequency switch including the semiconductor device for radio frequency switch, and a radio frequency module including the radio frequency switch.

A first semiconductor device for radio frequency switch according to an embodiment of the disclosure includes an SOI substrate and a gate electrode. The SOI substrate includes a buried oxide film and a semiconductor layer on a carrier substrate. The gate electrode is provided on the semiconductor layer. The semiconductor layer includes a first area below the gate electrode and a second area other than the first area. A third area is provided in at least part of the second area. A fourth area is provided in at least part of the first area. The fourth area has a different thickness from a thickness of the third area.

In the first semiconductor device for radio frequency switch according to the embodiment of the disclosure, the semiconductor layer includes the first area below the gate electrode and the second area other than the first area. The third area is provided in at least part of the second area. The fourth area is provided in at least part of the first area. The fourth area has the different thickness from the thickness of the third area. Accordingly, adjustment of the thickness of the fourth area as appropriate allows junction capacitance between the fourth area and an area adjacent to the fourth area to become invisible, resulting in reduction in the OFF capacitance. This leads to reduction in the product (Ron*Coff) of the ON resistance and the OFF capacitance.

A second semiconductor device for radio frequency switch according to an embodiment of the disclosure includes an SOI substrate and a gate electrode. The SOI substrate includes a buried oxide film and a semiconductor layer on a carrier substrate. The gate electrode is provided on the semiconductor layer and extended in one direction. The semiconductor layer includes a sixth area and a seventh area having a different thickness from a thickness of the sixth area. The sixth area and the seventh area are arranged alternatively along a lengthwise direction of the gate electrode.

In the second semiconductor device for radio frequency switch according to the embodiment of the disclosure, the semiconductor layer includes the sixth area and the seventh area having the different thickness from the thickness of the sixth area. The sixth area and the seventh area are arranged alternatively along the lengthwise direction of the gate electrode. Accordingly, adjustment of the thickness of the seventh area as appropriate allows junction capacitance between the seventh area and a area adjacent to the seventh area to become invisible in a cross-section taken perpendicularly to the lengthwise direction of the gate electrode, resulting in the reduction in the OFF capacitance. This leads to the reduction in the product (Ron*Coff) of the ON resistance and the OFF capacitance.

A first radio frequency switch according to an embodiment of the disclosure is provided with a switch region and a logic region. The switch region includes a semiconductor device for radio frequency switch. The logic region includes a semiconductor device for logic. The semiconductor device for radio frequency switch includes an SOI substrate and a first gate electrode. The SOI substrate includes a buried oxide film and a semiconductor layer on a carrier substrate. The first gate electrode is provided on the semiconductor layer. The semiconductor layer includes a first area below the first gate electrode and a second area other than the first area. A third area is provided in at least part of the second area. A fourth area is provided in at least part of the first area. The fourth area has a different thickness from a thickness of the third area.

A second radio frequency switch according to an embodiment of the disclosure is provided with a switch region and a logic region. The switch region includes a semiconductor device for radio frequency switch. The logic region includes a semiconductor device for logic. The semiconductor device for radio frequency switch includes an SOI substrate and a gate electrode. The SOI substrate includes a buried oxide film and a semiconductor layer on a carrier substrate. The gate electrode is provided on the semiconductor layer and extended in one direction. The semiconductor layer includes a sixth area and a seventh area having a different thickness from a thickness of the sixth area. The sixth area and the seventh area are arranged alternatively along a lengthwise direction of the gate electrode.

In the first radio frequency switch according to the embodiment of the disclosure, or in the second radio frequency switch according to the embodiment of the disclosure, in the switch region, switching between input and output of a signal is performed. In the logic region, a control of the switch region is performed.

A first radio frequency module according to an embodiment of the disclosure is provided with a radio frequency switch. The radio frequency switch includes a switch region and a logic region. The switch region includes a semiconductor device for radio frequency switch. The logic region includes a semiconductor device for logic. The semiconductor device for radio frequency switch includes an SOI substrate and a first gate electrode. The SOI substrate includes a buried oxide film and a semiconductor layer on a carrier substrate. The first gate electrode is provided on the semiconductor layer. The semiconductor layer includes a first area below the first gate electrode and a second area other than the first area. A third area is provided in at least part of the second area. A fourth area is provided in at least part of the first area. The fourth area has a different thickness from a thickness of the third area.

A second radio frequency module according to an embodiment of the disclosure is provided with a radio frequency switch. The radio frequency switch includes a switch region and a logic region. The switch region includes a semiconductor device for radio frequency switch. The logic region includes a semiconductor device for logic. The semiconductor device for radio frequency switch includes an SOI substrate and a gate electrode. The SOI substrate includes a buried oxide film and a semiconductor layer on a carrier substrate. The gate electrode is provided on the semiconductor layer and extended in one direction. The semiconductor layer includes a sixth area and a seventh area having a different thickness from a thickness of the sixth area. The sixth area and the seventh area are arranged alternatively along a lengthwise direction of the gate electrode.

In the first radio frequency module according to the embodiment of the disclosure, or in the second radio frequency module according to the embodiment of the disclosure, in the switch region of the radio frequency switch, the switching between the input and the output of the signal is performed. In the logic region, the control of the switch region is performed.

According to the first semiconductor device for radio frequency switch of the embodiment of the disclosure, the semiconductor layer includes the first area below the gate electrode and the second area other than the first area. The third area is provided in at least part of the second area. The fourth area is provided in at least part of the first area. The fourth area has the different thickness from the thickness of the third area. According to the second semiconductor device for radio frequency switch of the embodiment of the disclosure, the semiconductor layer includes the sixth area and the seventh area having the different thickness from the thickness of the sixth area. The sixth area and the seventh area are arranged alternatively along the lengthwise direction of the gate electrode. Hence, it is possible to reduce the product (Ron*Coff) of the ON resistance and the OFF capacitance.

According to the first or second radio frequency switch according to the embodiment of the disclosure, or according to the first or second radio frequency module according to the embodiment of the disclosure, the switch region of the radio frequency switch includes the first or second semiconductor device for radio frequency switch according to the embodiment of the disclosure in which the product (Ron*Coff) of the ON resistance and the OFF capacitance is reduced. Hence, it is possible to enhance insertion loss that is related to a condition in which a signal is allowed to be passed through with small loss, and insertion that is related to a condition in which little signal leakage into peripheral circuits occurs.

It is to be noted that some effects described here are not necessarily limitative, and any of other effects described herein may be achieved.

BRIEF DESCRIPTION OF DRAWINGS

FIG. 1 is a plan view of a configuration of a semiconductor device for radio frequency switch according to a first embodiment of the disclosure.

FIG. 2 is a cross-sectional view of the semiconductor device for radio frequency switch illustrated in FIG. 1, taken along a line II-II.

FIG. 3 is a plan view of an example of an overall configuration of the semiconductor device for radio frequency switch illustrated in FIG. 1.

FIG. 4 is a plan view of another example of the overall configuration of the semiconductor device for radio frequency switch illustrated in FIG. 1.

FIG. 5 illustrates a semiconductor device for radio frequency switch according to a reference example 1, with ON resistance decomposed into components.

FIG. 6 illustrates the semiconductor device for radio frequency switch according to the reference example 1, with OFF capacitance decomposed into components.

FIG. 7 illustrates a semiconductor device for radio frequency switch according to a reference example 2, with OFF capacitance decomposed into components.

FIG. 8 is a cross-sectional view that illustrates a method of manufacturing the semiconductor device for radio frequency switch illustrated in FIG. 2, in the order of procedure.

FIG. 9 is a cross-sectional view that illustrates a process following FIG. 8.

FIG. 10 is a cross-sectional view that illustrates a process following FIG. 9.

FIG. 11 is a cross-sectional view that illustrates a process following FIG. 10.

FIG. 12 is a cross-sectional view that illustrates a process following FIG. 11.

FIG. 13 is a cross-sectional view that illustrates a process following FIG. 12.

FIG. 14 is a cross-sectional view that illustrates a process following FIG. 13.

FIG. 15 is a cross-sectional view of a configuration of a semiconductor device for radio frequency switch according to a second embodiment of the disclosure.

FIG. 16 is a cross-sectional view that illustrates a method of manufacturing the semiconductor device for radio frequency switch illustrated in FIG. 15, in the order of procedure.

FIG. 17 is a cross-sectional view that illustrates a process following FIG. 16.

FIG. 18 is a cross-sectional view that illustrates a process following FIG. 17.

FIG. 19 is a cross-sectional view that illustrates a process following FIG. 18.

FIG. 20 is a cross-sectional view of a configuration of a semiconductor device for radio frequency switch according to a modification example 1.

FIG. 21 is a plan view of a configuration of a semiconductor device for radio frequency switch according to a third embodiment of the disclosure.

FIG. 22 is a cross-sectional view of the semiconductor device for radio frequency switch illustrated in FIG. 21, taken along a line XXII-XXII.

FIG. 23 is a cross-sectional view that illustrates an increase in an effective gate length of the semiconductor device for radio frequency switch illustrated in FIG. 22.

FIG. 24 is a cross-sectional view of the semiconductor device for radio frequency switch illustrated in FIG. 21, taken along a line XXIV-XXIV.

FIG. 25 is a cross-sectional view of the semiconductor device for radio frequency switch illustrated in FIG. 21, taken along a line XXV-XXV.

FIG. 26 is a plan view of an example of an overall configuration of the semiconductor device for radio frequency switch illustrated in FIG. 21.

FIG. 27 is a plan view of another example of the overall configuration of the semiconductor device for radio frequency switch illustrated in FIG. 21.

FIG. 28 is a plan view of still another example of the overall configuration of the semiconductor device for radio frequency switch illustrated in FIG. 21.

FIG. 29 is a plan view of still another example of the overall configuration of the semiconductor device for radio frequency switch illustrated in FIG. 21.

FIG. 30 is a plan view of still another example of the overall configuration of the semiconductor device for radio frequency switch illustrated in FIG. 21.

FIG. 31 is a cross-sectional view of a configuration of a semiconductor device for radio frequency switch according to a fourth embodiment of the disclosure.

FIG. 32 is a cross-sectional view of a configuration of a semiconductor device for radio frequency switch according to a modification example 2.

FIG. 33 is a cross-sectional view of a configuration of a semiconductor device for radio frequency switch according to a modification example 3.

FIG. 34 is a plan view of a schematic configuration of a radio frequency switch.

FIG. 35 is a cross-sectional view of a configuration of a semiconductor device for radio frequency switch that constitutes a switch region illustrated in FIG. 34.

FIG. 36 is a cross-sectional view of a configuration of a semiconductor device for logic that constitutes a logic region illustrated in FIG. 34.

FIG. 37 is a circuit diagram of an SP10T switch, as an example of the switch region.

FIG. 38 is a circuit diagram of an SPST switch that serves as a basic configuration of the SP10T switch illustrated in FIG. 37.

FIG. 39 is an equivalent circuit diagram of the SPST switch illustrated in FIG. 38.

FIG. 40 is an equivalent circuit diagram of the SPST switch illustrated in FIG. 39, in an ON state.

FIG. 41 is an equivalent circuit diagram of the SPST switch illustrated in FIG. 39, in an OFF state.

FIG. 42 is a block diagram of an example of a radio frequency module.

DESCRIPTION OF EMBODIMENTS

In the following, some embodiments of the disclosure are described in detail with reference to the drawings. Note that description is made in the following order.

1. First Embodiment (an example in which a semiconductor layer includes a first area below a gate electrode; a channel region is provided in the first area; and the channel region has a smaller thickness than a thickness of a source region and a drain region)

2. Second Embodiment (an example in which, in the forgoing first embodiment, a low dielectric area is provided in an interlayer insulating film, above an LDD area)

3. Modification Example 1 (an example in which the low dielectric area is provided above the gate electrode)

4. Third Embodiment (an example in which a semiconductor layer includes a sixth area and a seventh area that are of different thicknesses; and the sixth area and the seventh area are arranged alternatively along a lengthwise direction of a gate electrode)

5. Modification Example 2 (an example in which, in the forgoing third embodiment, a low dielectric area is provided in an interlayer insulating film, above the seventh area)

6. Modification Example 3 (an example in which the low dielectric area is provided above the sixth area)

7. Modification Example 4 (an example in which the low dielectric area is extended along the lengthwise direction of the gate electrode)

8. Application Example (a radio frequency switch and a radio frequency module)

First Embodiment

FIGS. 1 and 2 respectively illustrate a plan configuration and a cross-sectional configuration of a semiconductor device for radio frequency switch according to a first embodiment of the disclosure. A semiconductor device for radio frequency switch 1 may be used in, for example, an antenna switch. The semiconductor device for radio frequency switch 1 includes, for example, an SOI substrate 10 and a gate electrode 20. The SOI substrate 10 includes a buried oxide film 12 and a semiconductor layer 13 on a carrier substrate 11. The gate electrode 20 is provided on the semiconductor layer 13. The gate electrode 20 may be extended in one direction (e.g., in a Y direction), as illustrated in FIG. 1.

It is to be noted that, in the following description and figures, a lengthwise direction of the gate electrode 20 is denoted as the Y direction, and a widthwise direction is denoted as an X direction. A direction orthogonal to both of them is denoted as a Z direction.

The SOI substrate 10 includes, for example, the buried oxide film 12 and the semiconductor layer 13 on the carrier substrate 11. The carrier substrate 11 may be made of a highly resistive silicon (Si) substrate. The buried oxide film 12 may be made of silicon oxide film ($SiO_2$). The semiconductor layer 13 may be made of silicon (Si). The semiconductor layer 13 includes a first area A1 below the gate electrode 20 and a second area A2 other than the first area A1. A source area A3S and a drain area A3D may be provided in the second area A2. The source area A3S and the drain area A3D may include a source diffusion layer 13S and a drain diffusion layer 13D that may be high-concentration diffusion layers. The source diffusion layer 13S and the drain diffusion layer 13D may be provided over a full thickness (from an upper surface to a lower surface) of the source area A3S and the drain area A3D. A channel area A4 may be provided in the first area A1.

A thickness D4 of the channel area A4 is different from a thickness D3 of the source area A3S and the drain area A3D. In one specific example, the thickness D4 of the channel area A4 is smaller than the thickness D3 of the source area A3S and the drain area A3D. Hence, in the semiconductor device for radio frequency switch 1, it is possible to reduce a product (Ron*Coff) of ON resistance and OFF capacitance.

Here, the source area A3S and the drain area A3D correspond to one specific example of a "third area" of one embodiment of the disclosure. The channel area A4 corresponds to one specific example of a "fourth area" of one embodiment of the disclosure.

An LDD (Light Doped Drain) area A5 may be provided between the channel area A4 and the source area A3S, and between the channel area A4 and the drain area A3D. The LDD area A5 may restrain a single channel effect. The LDD area A5 may include an LDD diffusion layer 13LDD that may be a low-concentration diffusion layer. The LDD diffusion layer 13LDD may be provided over a full thickness (from an upper surface to a lower surface) of the LDD area A5.

A thickness D5 of the LDD area A5 may be, for example, equal to the thickness D4 of the channel area A4. One specific example may be as follows. A thickness of the semiconductor layer 13 may be about 100 nm to 200 nm both inclusive, according to specifications of commercially available SOI substrates. In the source area A3S and the drain area A3D, profile design may be performed to allow the source diffusion layer 13S and the drain diffusion layer 13D to reach the buried oxide film 12. In the LDD area A5, profile design may be performed to allow a depth of the LDD diffusion layer 13LDD to be one half of a depth of the source diffusion layer 13S and the drain diffusion layer 13D. Accordingly, when the original thickness of the semiconductor layer 13 is, for example, about 100 nm to 200 nm both inclusive, the thickness D4 of the channel area A4 and the thickness D5 of the LDD area A5 may be, for example, about 50 nm to 100 nm both inclusive.

In one preferred example, a shoulder S may be provided on a border between the LDD area A5 and the source area A3S, and on a border between the LDD area A5 and the drain area A5D. The shoulder S may be a simple configuration, but makes it possible to provide the difference between the thickness D4 of the channel area A4 or the thickness D5 of the LDD area A5 and the thickness D3 of the source area A3S and the drain area A3D. In other words, the channel area A4 and the LDD area A5 may constitute a concave area with respect to the source area A3S and the drain area A3D, i.e., a recessed area having a smaller height from an upper surface of the buried oxide film 12 than those of the source area A3S and the drain area A3D. A distance from upper surfaces of the channel area A4 and the LDD area A5 to the buried oxide film 12 may be smaller than a distance from upper surfaces of the source area A3S and the drain area A3D to the buried oxide film 12.

Here, the LDD area A5 corresponds to one specific example of a "fifth area" of one embodiment of the disclosure.

An interlayer insulating film 30 may be provided on the semiconductor layer 13 and the gate electrode 20. The interlayer insulating film 30 may be made of, for example, silicon oxide ($SiO_2$) film. A source electrode 40S and a drain electrode 40D may be provided on the interlayer insulating film 30. The source electrode 40S may be coupled to the source area A3S through a source-side contact plug 31S provided in the interlayer insulating film 30. The drain electrode 40D may be coupled to the drain area A3D through a drain-side contact plug 31D provided in the interlayer insulating film 30. The source electrode 40S and the drain electrode 40D may be extended in the Y direction in parallel with the gate electrode 20, as illustrated in FIG. 1.

FIG. 3 illustrates an overall configuration of the semiconductor device for radio frequency switch 1. In the semiconductor device for radio frequency switch 1, the gate electrode 20 may have a length of several millimeters, in order to allow for a large current flow. In one specific example, the gate electrode 20 may have the length of, for example, about 2 mm to 5 mm both inclusive, depending on FET characteristics. Accordingly, as illustrated in FIG. 3, a side-by-side arrangement of the gate electrodes 20 each having a certain unit length may provide a desirable length of the gate electrode 20. In one specific example, when the unit length of the gate electrode 20 is 25 μm, a layout configuration with an arrangement of 160 pieces of the gate electrodes 20 may provide the length of 4 mm of the gate electrode 20.

As illustrated in FIG. 3, the plurality of gate electrodes 20 in the side-by-side arrangement may be coupled together by, for example, a link part 21. As with the channel area R4 and the LDD area R5, as illustrated in FIG. 3, an area of the semiconductor layer 13 below and in the vicinity of the link part 21 may have a smaller thickness than that of the source area R3S and the drain area R3D.

The link part 21 may be provided at one ends of the gate electrodes 20, as illustrated in FIG. 3. Alternatively, the link parts 21 may be provided at both ends of the gate electrodes 20, as illustrated in FIG. 4.

In the following, description is given in further details on the configuration of the semiconductor device for radio frequency switch 1 with reference to FIGS. 5 to 7.

Reference Example 1

FIGS. 5 and 6 illustrate a semiconductor device for radio frequency switch 1 R1 according to a reference example 1, respectively with the ON resistance and the OFF capacitance decomposed into components. In the semiconductor device for radio frequency switch 1R1 according to the reference example 1, the channel area A4 and the LDD area A5 are not thinned, but have equal thicknesses to those of the source area A3S and the drain area A3D. Otherwise, the semiconductor device for radio frequency switch 1R1 according to the reference example 1 may have same configurations as those of the semiconductor device for radio frequency switch 1 according to this embodiment as described.

As illustrated in FIG. 5, the ON resistance may include, for example, the following. Diffusion layer resistance R3S and R3D generated in the source area A3S and the drain area A3D. Channel resistance R4 generated in the channel area A4. LDD resistance R5 generated in the LDD area A5. Resistance R40S and R40D generated in the source electrode 40S and the drain electrode 40D. Contact resistance R3S-P generated between the source area A3S and the source-side contact plug 31S. Contact resistance R3D-P generated between the drain area A3D and the drain-side contact plug 31D.

As illustrated in FIG. 6, the OFF capacitance may include capacitance of an FET itself and inter-wiring capacitance. The inter-wiring capacitance may be inter-wiring capacitance CS-D generated between the source electrode 40S and the drain electrode 40D. The capacitance of the FET itself may include the following. Capacitance C12 generated between the source area A3S or the drain area A3D and the carrier substrate 11. Capacitance C30 generated between the source area A3S or the drain area A3D and the gate electrode 20. Channel-LDD junction capacitance C4-5 generated between the channel area A4 and the LDD area A5. Source-body and drain-body junction capacitance CS-B and CD-B generated between a deep part of the semiconductor layer 13 and the source area R3S or the drain area R3D.

In order to reduce the inter-wiring capacitance CS-D, it may be desirable to increase an FET size (a pitch between the gate electrodes 20). This, however, may contribute to an increase in a size of a radio frequency switch, and an increase in the diffusion layer resistance R3S and R3D generated in the source area A3S and the drain area A3D, resulting in an increase in the ON resistance.

Meanwhile, in order to reduce the OFF capacitance, it may be desirable to decrease the FET size. This, however, may cause an increase in the inter-wiring capacitance CS-D, resulting in an increase in the OFF capacitance, and difficulty in the reduction in the product (Ron*Coff) of the ON resistance and the OFF capacitance. In other words, there is a trade-off between the ON resistance and the OFF capacitance.

Reference Example 2

FIG. 7 illustrates a semiconductor device for radio frequency switch 1 R2 according to a reference example 1, with the OFF capacitance decomposed into components. In the semiconductor device for radio frequency switch 1R2 according to the reference example 2, the source area A3S and the drain area A3D are thinned to an equal thickness to the thickness of the channel area A4 and the LDD area A5. Otherwise, the semiconductor device for radio frequency switch 1R2 according to the reference example 2 may have same configurations as those of the semiconductor device for radio frequency switch 1 according to this embodiment as described above.

In the reference example 2, the source-body and drain-body junction capacitance CS-B and CD-B of the reference example 1 illustrated in FIG. 6 may be reduced. The source-body and drain-body junction capacitance CS-B and CD-B may be generated between the deep part of the semiconductor layer 13 and the source area A3S or the drain area A3D. Meanwhile, the thickness of the source area A3S and the drain area A3D becomes smaller. This causes an increase in the diffusion layer resistance R3S and R3D, and an increase in the contact resistance R3S-P and R3D-P.

In contrast, in the semiconductor device for radio frequency switch 1 according to this embodiment, the thickness D4 of the channel area A4 and the thickness D5 of the LDD area A5 may be smaller than the thickness D3 of the source area A3S and the drain area A3D. Accordingly, in the semiconductor device for radio frequency switch 1, it is possible to reduce the source-body and drain-body junction capacitance CS-B and CD-B generated between the deep part of the semiconductor layer 13 and the source area R3S or the drain area R3D in the reference example 1 illustrated in FIG. 6. This leads to the reduction in the OFF capacitance. Moreover, the thickness of the source area A3S and the drain area A3D may be small. This allows for avoidance of the increase in the ON resistance due to the increase in the diffusion layer resistance R3S and R3D and the increase in the contact resistance R3S-P and R3D-P as illustrated in FIG. 5. Hence, in the semiconductor device for radio frequency switch 1 according to this embodiment, it is possible to reduce the product (Ron*Coff) of the ON resistance and the OFF capacitance.

The semiconductor device for radio frequency switch 1 may be manufactured, for example, as follows.

FIGS. 8 to 14 illustrate a method of manufacturing the semiconductor device for radio frequency switch 1 in the order of procedure. First, as illustrated in FIG. 8, the SOI substrate 10 may be prepared. The SOI substrate 10 may include the buried oxide film 12 and the semiconductor layer 13 on the carrier substrate 11. A surface of the SOI substrate 10 may be subjected to thermal oxidation, to form a silicon oxide ($SiO_2$) film 14A. The silicon oxide film 14A may have a thickness of, for example, about 20 nm.

Next, as illustrated in FIG. 8 as well, a silicon nitride ($Si_3N_4$) film 14B may be formed on the silicon oxide layer 14A, by, for example, a CVD (Chemical Vapor Deposition) method. The silicon nitride film 14B may have a thickness of, for example, about 200 nm.

Thereafter, as illustrated in FIG. 8 as well, a resist film 14C may be formed on the silicon nitride film 14B. The resist film 14C may be provided with an aperture that may be confronted with the channel area A4 and the LDD area A5. The silicon nitride film 14B and the silicon oxide film 14A on the channel area A4 and the LDD area A5 may be removed.

Thereafter, as illustrated in FIG. 9, the resist film 14C may be removed. A silicon oxide film ($SiO_2$) 14D may be formed in the channel area A4 and the LDD area A5, by steam oxidation at, for example, 1000° C. to 1050° C. both inclusive. In one preferred example, a thickness of the silicon oxide film 14D may be about 100 nm, when forming the shoulder S having a height of, for example, about 50 nm.

After forming the silicon oxide film 14D, as illustrated in FIG. 10, the silicon oxide film 14D may be removed by, for example, a wet process. Thus, the shoulders S may be formed on the border between the LDD area A5 and the source area A3S, and on the border between the LDD area A5 and the drain area A3D.

After forming the shoulders S, as illustrated in FIG. 11, the gate electrode 20 may be formed on the semiconductor layer 20. By a general manufacturing procedure, the LDD diffusion layer 13LDD in the channel area A4 and the LDD area A5 may be formed. The thickness D4 of the channel area A4 and the thickness D5 of the LDD area A5 may become smaller than the thickness D3 of the source area A3S and the drain area A3D.

Thereafter, as illustrated in FIG. 11 as well, an insulating film 14E for formation of side walls may be formed. A silicon oxide ($SiO_2$) film, a silicon nitride ($Si_3N_4$) film, or a stacked film of them may be used as the insulating film 14E.

After forming the insulating film 14E, as illustrated in FIG. 12, side walls 14F may be formed on side surfaces of the gate electrode 20, by dry etching. Thereafter, as illustrated in FIG. 13, the source diffusion layer 13S and the drain diffusion layer 13D may be formed in the source area A3S and the drain area A3D. Thereafter, as illustrated in FIG. 14, the side walls 14F may be removed. It is to be noted that the side walls 14F may be left there.

Thereafter, as illustrated in FIG. 2, the interlayer insulating film 30 may be formed on the gate electrode 20 and the semiconductor layer 13. The interlayer insulating film 30 may be made of, for example, a silicon oxide ($SiO_2$) film The source-side contact plug 31S and the drain-side contact plug 31D may be formed in the interlayer insulating film 30. The source electrode 40S and the drain electrode 40D may be coupled to the source area A3S and the drain area A3D. Thus, the semiconductor device for radio frequency switch 1 as illustrated in FIG. 2 may be completed.

In the semiconductor device for radio frequency switch 1, the thickness D4 of the channel area A4 and the thickness D5 of the LDD area A5 may be smaller than the thickness D3 of the source area A3S and the drain area A3D. This causes the reduction in the source-body and drain-body junction capacitance CS-B and CD-B generated between the deep part of the semiconductor layer 13 and the source area R3S or the drain area R3D in the reference example 1 illustrated in FIG. 6. Thus, the OFF capacitance may be reduced. According to simulation results, the OFF capacitance may be reduced by about 10% when the thickness D4 of the channel area A4 and the thickness D5 of the LDD area A5 are one half of the thickness D3 of the source area A3S and the drain area A3D. Moreover, the thickness of the source area A3S and the drain area A3D may be large, allowing for avoidance of the increase in the ON resistance due to the increase in the diffusion layer resistance R3S and R3D and the increase in the contact resistance R3S-P and R3D-P as illustrated in FIG. 5. Accordingly, the product (Ron*Coff) of the ON resistance and the OFF capacitance may be reduced.

As described, in this embodiment, the thickness D4 of the channel area A4 may be smaller than the thickness D3 of the source area A3S and the drain area A3D. Hence, it is possible to reduce the product (Ron*Coff) of the ON resistance and the OFF capacitance. This allows for enhancement in the insertion loss and the isolation that are important characteristics of the radio frequency switch.

Second Embodiment

FIG. 15 illustrates a cross-sectional configuration of a semiconductor device for radio frequency switch 1A according to a second embodiment of the disclosure. In the semiconductor device for radio frequency switch 1A, a low dielectric area 32 may be provided in the interlayer insulating film 30. This allows for the reduction in the inter-wiring capacitance CS-D as illustrated in FIG. 6, leading to further reduction in the OFF capacitance. Otherwise, the semiconductor device for radio frequency switch 1A may have same configurations as those of the semiconductor device for radio frequency switch 1 according to the forgoing first embodiment.

The low dielectric area 32 may have a lower dielectric constant than a dielectric constant of a silicon oxide ($SiO_2$) film (dielectric constant 3.9) that constitutes the interlayer insulating film 30. The low dielectric area 32 may be, for example, a cavity. There is no particular limitation regarding an inside of the cavity. For example, air (dielectric constant 1.0) may exist in the inside of the cavity. Alternatively, the inside of the cavity may be a vacuum. Moreover, there is no particular limitation on a position of the low dielectric area 32. In one preferred example, the low dielectric area 32 may be provided above a source-side LDD area A5S and a drain-side LDD area A5D.

The semiconductor device for radio frequency switch 1A may be manufactured, for example, as follows.

FIGS. 16 to 19 illustrate a method of manufacturing the semiconductor device for radio frequency switch 1A in the order of procedure. It is to be noted that the processes that overlap with those in the first embodiment are described with reference to FIGS. 8 to 14.

First, in a similar manner to the first embodiment, as in the processes illustrated in FIGS. 8 to 14, the shoulders S may be formed in the semiconductor layer 13 of the SOI substrate 10. Thereafter, the gate electrode 20, the channel area A4, the LDD area A5, the source area A3S, and the drain area A3D may be formed.

Next, as illustrated in FIG. 16, a lower interlayer insulating film 30A may be formed on the gate electrode 20 and the semiconductor layer 13, by, for example, deposition by the CVD method and a smoothing process. The lower interlayer insulating film 30A may be made of, for example, a silicon oxide ($SiO_2$) film, and have a thickness of, for example, about 1 µm. A resist film 33 may be formed on the lower interlayer insulating film 30A. An aperture may be formed in the resist film 33. The aperture may be confronted with the LDD area A5.

Thereafter, as illustrated in FIG. 17, a groove 34 may be formed in the lower interlayer insulating film 30A by RIE (Reactive Ion Etching) with the resist film 33 serving as a mask.

Thereafter, as illustrated in FIG. 18, an upper interlayer insulating film 30B may be formed by, for example, a plasma-CVD method. The upper interlayer insulating film 30B may be made of a silicon oxide ($SiO_2$) film having low smoothness, and have a thickness of, for example, about 0.3 µm. Because of the low smoothness, the upper interlayer insulating film 30B may fail in depositing sufficiently inside the groove 34. Thus, the cavity, i.e., the low dielectric area 32, may be formed inside the groove 34.

Thereafter, as illustrated in FIG. 19, the source-side contact plug 31S and the drain-side contact plug 31D may be formed in the interlayer insulating film 30. The source electrode 40S and the drain electrode 40D may be coupled to the source area A3S and the drain area A3D. Thus, the semiconductor device for radio frequency switch 1A illustrated in FIG. 15 may be completed.

In the semiconductor device for radio frequency switch 1A, it is possible to reduce the inter-wiring capacitance CS-D by the low dielectric area 32, and to reduce the OFF capacitance even more, in addition to workings and effects of the forgoing first embodiment. Hence, it is possible to reduce the product (Ron*Coff) of the ON resistance and the OFF capacitance even more, leading to further enhancement in the insertion loss and the isolation that are important characteristics of the radio frequency switch.

Modification Example 1

It is to be noted that, in the forgoing embodiment, description is given on a case in which the low dielectric area 32 may be provided above the LDD area A5. However, for example, as illustrated in FIG. 20, the low dielectric area 32 may be provided above the gate electrode 20. Alternatively, the low dielectric area 32 may be provided at positions other than the positions as illustrated in FIG. 15 or FIG. 20.

Third Embodiment

FIGS. 21 and 22 respectively illustrate a plan configuration and a cross-sectional configuration of a semiconductor device for radio frequency switch according to a third embodiment of the disclosure. The semiconductor device for radio frequency switch 1B may be used in, for example, an antenna switch. The semiconductor device for radio frequency switch 1B includes, for example, the SOI substrate 10 and the gate electrode 20. The SOI substrate 10 includes the buried oxide film 12 and the semiconductor layer 13 on the carrier substrate 11. The gate electrode 20 is provided on the semiconductor layer 13 and extended in one direction (e.g., in the Y direction).

The SOI substrate 10 includes, for example, the buried oxide film 12 and the semiconductor layer 13 on the carrier substrate 11. The carrier substrate 11 may be made of a highly resistive silicon (Si) substrate. The buried oxide film 12 may be made of a silicon oxide ($SiO_2$) film. The semiconductor layer 13 may be made of silicon (Si).

The semiconductor layer 13 includes a sixth area A6 and a seventh area A7. A thickness D7 of the seventh area A7 is different from a thickness D6 of the sixth area A6. In one specific example, the thickness D7 of the seventh area A7 may be smaller than the thickness D6 of the sixth area A6. The sixth area A6 and the seventh area A7 are arranged alternatively along the lengthwise direction (the Y direction) of the gate electrode 20. Hence, in the semiconductor device for radio frequency switch 1B, it is possible to reduce the product (Ron*Coff) of the ON resistance and the OFF capacitance.

In one preferred example, the shoulder S may be provided on a border between the sixth area A6 and the seventh area A7. The shoulder S may be a simple configuration, but makes it possible to provide the difference between the thickness D6 of the sixth area A6 and the thickness D7 of the seventh area A7. In other words, the seventh area A7 may constitute a concave area with respect to the sixth area A6, i.e., a recessed area having a smaller height from the upper surface of the buried oxide film 12 than that of the sixth area A6. A distance from an upper surface of the seventh area A7 to the buried oxide film 12 may be smaller than a distance from an upper surface of the sixth area A6 to the buried oxide film 12.

Moreover, in this embodiment, the sixth area A6 and the seventh area A7 are arranged alternatively along the lengthwise direction (the Y direction) of the gate electrode 20. This causes an increase in an effective length of the gate electrode 20, leading to a decrease in the FET size that provides the gate electrode 20 having a desired length.

In one example, as illustrated in FIG. 23, when the length of the gate electrode 20 in the Y direction is 25 μm, and a pitch PS of the shoulders S is 0.25 μm, fifty protrusions P13 may be formed. The fifty protrusions P13 each may have the shoulders S on both sides. Let us calculate the effective length of the gate electrode 20 with assumption that the thickness D6 of the sixth area A6 is 150 nm, the height HS of the shoulder S is 75 nm, and the thickness D7 of the seventh area A7 is 75 nm. Because side walls of the protrusions P13 are included in the length of the gate electrode 20, the effective length of the gate electrode 20 may be increased by 75 μn on one side, 150 μm on both sides, per each protrusion P13. Accordingly, with the fifty protrusions P13, the effective length of the gate electrode 20 may be increased by 7.5 μm, allowing for the reduction in the FET size by that amount. This leads to an increase in a theoretical yield per one sheet of wafer, which is advantageous in terms of costs as well.

FIG. 24 illustrates a cross-sectional configuration in the widthwise direction of the gate electrode 20 in the seventh area A7. In the cross-sectional configuration in the seventh area A7 of the semiconductor device for radio frequency switch 1B, the thickness D4 of the channel area A4 and the thickness D5 of the LDD area A5 may be smaller than the thickness D3 of the source area A3S and the drain area A3D, as with the semiconductor device for radio frequency switch 1 according to the first embodiment. In the seventh area A7, it is therefore possible to reduce the source-body and drain-body junction capacitance CS-B and CD-B generated between the deep part of the semiconductor layer 13 and the source area R3S or the drain area R3D in the reference example 1 illustrated in FIG. 6. This leads to the reduction in the OFF capacitance.

FIG. 25 illustrates a cross-sectional configuration in the widthwise direction of the gate electrode 20 in the sixth area A6. In the cross-sectional configuration in the sixth area A6 of the semiconductor device for radio frequency switch 1B, a thickness D1 of the first area A1 below the gate electrode 20 may be equal to a thickness D2 of the second area A2 other than the first area A1. In other words, the channel area A4 and the LDD area A5 may not be thinned, and may have equal thicknesses to the thickness D3 of the source area A3S and the drain area A3D.

The interlayer insulating film 30 may be provided on the semiconductor layer 13 and the gate electrode 20. The interlayer insulating film 30 may be made of, for example, a silicon oxide ($SiO_2$) film. The source electrode 40S and the drain electrode 40D may be provided on the interlayer insulating film 30. The source electrode 40S may be coupled to the source area A3S through the source-side contact plug 31S provided in the interlayer insulating film 30. The drain electrode 40D may be coupled to the drain area A3D through the drain-side contact plug 31D provided in the interlayer insulating film 30. The source electrode 40S and the drain electrode 40D may be extended in the Y direction in parallel with the gate electrode 20, as illustrated in FIG. 21.

FIG. 26 illustrates an overall configuration of the semiconductor device for radio frequency switch 1B. In the semiconductor device for radio frequency switch 1B, the gate electrode 20 may have the length of several millimeters, in order to allow for the large current flow. In one specific example, the gate electrode 20 may have the length of, for example, about 2 mm to 5 mm both inclusive, depending on the FET characteristics. Accordingly, as illustrated in FIG. 26 the side-by-side arrangement of the gate electrodes 20 each having the certain unit length may provide the desirable length of the gate electrode 20. In one specific example, when the unit length of the gate electrode 20 is 25 μm, the layout configuration with the arrangement of 160 pieces of the gate electrodes 20 may provide the length of 4 mm of the gate electrode 20.

As illustrated in FIG. 26, the plurality of gate electrodes 20 in the side-by-side arrangement may be coupled together by, for example, the link part 21. As illustrated in FIG. 26, the seventh area A7 may be provided in the area below and in the vicinity of the link part 21. In one alternative, as illustrated in FIG. 27, the seventh area A7 may not be provided in the area below and in the vicinity of the link part 21.

The link part 21 may be provided at one ends of the gate electrodes 20, as illustrated in FIGS. 26 and 27. Alternatively, the link parts 21 may be provided at both ends of the gate electrodes 20, as illustrated in FIGS. 28 and 29.

A method of manufacturing the semiconductor device for radio frequency switch 1B may be similar to that of the semiconductor device for radio frequency switch 1 according to the forgoing first embodiment. In other words, the semiconductor device for radio frequency switch 1B may be manufactured, for example, by a method of combination of formation of desired patterns, thermal oxidation, and wet etching. Alternatively, the semiconductor device for radio frequency switch 1B may be manufactured, for example, by a method of the formation of the desired patterns, and RIE.

It is to be noted that utilization of methods other than these methods may be also possible.

In the semiconductor device for radio frequency switch 1B, the sixth area A7 and the seventh area A7 having different thicknesses are arranged alternatively along the lengthwise direction (the Y direction) of the gate electrode 20. It is therefore possible, in the seventh area A7, to reduce the source-body and drain-body junction capacitance CS-B and CD-B generated between the deep part of the semiconductor layer 13 and the source area R3S or the drain area R3D in the reference example 1 illustrated in FIG. 6. This leads to the reduction in the OFF capacitance. Moreover, the effective length of the gate electrode 20 may be increased, allowing for the reduction in the FET size that provides the gate electrode 20 having the desirable length. This leads to the increase in the theoretical yield per one sheet of wafer, which is advantageous in terms of costs as well.

It is to be noted that, in the third embodiment as described, description is given on a case in which the plurality of sixth areas A6 and the plurality of seventh areas A7 are arranged alternatively along the direction of extension of the gate electrode 20. As illustrated in FIG. 30, however, the single seventh area A7 may be provided for each piece of the gate electrodes 20.

Fourth Embodiment

FIG. 31 illustrates a cross-sectional configuration of a semiconductor device for radio frequency switch 1C according to a fourth embodiment of the disclosure. In the semiconductor device for radio frequency switch 1C, the low dielectric area 32 may be provided in the interlayer insulating film 30, in the third embodiment as described. This allows for the reduction in the inter-wiring capacitance C40SD as illustrated in FIG. 6, leading to further reduction in the OFF capacitance. Otherwise, the semiconductor device for radio frequency switch 1C may have same configurations as those of the semiconductor device for radio frequency switch 1B according to the forgoing third embodiment.

The low dielectric area 32 may have the lower dielectric constant than the dielectric constant of the silicon oxide (SiO$_2$) film (dielectric constant 3.9) that constitutes the interlayer insulating film 30. The low dielectric area 32 may be, for example, the cavity. There is no particular limitation regarding the inside of the cavity. For example, air (dielectric constant 1.0) may exist in the inside of the cavity. Alternatively, the inside of the cavity may be a vacuum. Moreover, there is no particular limitation on the position of the low dielectric area 32. In one preferred example, the low dielectric area 32 may be provided, for example, above the seventh area A7 in which the thickness of the semiconductor layer 13 is small.

A method of manufacturing the semiconductor device for radio frequency switch 1C may be similar to those of the second and third embodiments. In other words, the semiconductor device for radio frequency switch 1C may be manufactured in a similar manner to the forgoing third embodiment, except for forming the low dielectric area 32 by the formation of the desired patterns, and RIE. It is to be noted that utilization of methods other than these methods may be also possible.

Modification Examples 2 and 3

In the forgoing fourth embodiment, description is given on a case in which the low dielectric area 32 may be provided above the seventh area A7. As illustrated in FIG. 32, however, the low dielectric area 32 may be provided above the sixth area A6 in which the thickness of the semiconductor layer 13 is large. In another alternative, as illustrated in FIG. 33, the low dielectric area 32 may be provided continuously above the sixth area A6 and the seventh area A7 along the direction of the extension of the gate electrode 20.

Application Examples

The semiconductor devices for radio frequency switch 1, and 1A to 1C as described in the forgoing embodiments may be used in, for example, a radio frequency module (a wireless communication apparatus) in a mobile communication system or any other communication system. In one specific example, the semiconductor devices for radio frequency switch 1, and 1A to 1C as described in the forgoing embodiments may be used as a radio frequency switch (an antenna switch) of the radio frequency module (the wireless communication apparatus).

FIG. 34 illustrates a schematic configuration of a radio frequency switch 2. The radio frequency switch 2 is provided with, for example, a switch region 2A and a logic region 2B on the SOI substrate 10.

FIG. 35 illustrates a cross-sectional configuration of a semiconductor device for radio frequency switch 2A1 that constitutes the switch region 2A illustrated in FIG. 34. The semiconductor device for radio frequency switch 2A1 may include, for example, the semiconductor device for radio frequency switch 1 described in the forgoing first embodiment. In other words, in the semiconductor device for radio frequency switch 2A1, the thickness D4 of the channel area A4 and the thickness D5 of the LDD area A5 may be smaller than the thickness D3 of the source area A3S and the drain area A3D, as with the semiconductor device for radio frequency switch 1 according to the first embodiment. This allows for the reduction in the source-body and drain-body junction capacitance CS-B and CS-D generated between the deep part of the semiconductor layer 13 and the source area R3S or the drain area R3D in the reference example 1 illustrated in FIG. 6. This leads to the reduction in the OFF capacitance.

It is to be noted that the semiconductor device for radio frequency switch 2A1 may include any one of the semiconductor devices for radio frequency switch 1A to 1C described in other embodiments or modification examples.

FIG. 36 illustrates a cross-sectional configuration of a semiconductor device for logic 2B1 that constitutes the logic region 2B illustrated in FIG. 23. In the semiconductor device for logic 2B1, the thickness D1 of the first area A1 below the gate electrode 20 may be equal to the thickness D2 of the second area A2 other than the first area A1. In other words, the channel area A4, the LDD area A5, the source area A3S, and the drain area A3D may not be thinned. Because of the large thicknesses of the channel area A4, the LDD area A5, the source area A3S, and the drain area A3D, the semiconductor device for logic 2B1 may have a sufficient FET breakdown voltage, and may constitute a control circuit of the logic region 2B.

FIG. 37 illustrates an SP10T (Single Pole 10 Through) switch 2C, as one example of the switch region 2A. The SP10T switch 2C may include, for example, one pole and ten contacts. The pole may be coupled to an antenna ANT. The SP10T switch 2C may have a basic configuration of an SPST (Single Pole Single Through) switch 2D as illustrated in FIG. 38. Combination of the SPST switches 2D may constitute the SP10T switch 2C. It is to be noted that the switch region 2A is not limited to the SP10T switch 2C as illustrated in FIG. 37, but may have various configurations such as SPDT (Single Pole Double Through), SP3T, . . . , SPNT (N is a real number).

FIG. 39 illustrates an equivalent circuit of the SPST switch 2D illustrated in FIG. 38. The SPST switch 2D may include a first port Port1, a second port Port2, a first switching element FET1, and a second switching element FET2. The first port Port1 may be coupled to the antenna ANT. The first switching element FET1 may be coupled between the first port Port1 and a ground. The second switching element FET2 may be coupled between the first port Port1 and the second port Port2.

In the SPST switch 2D, a control voltage may be applied to gates of the first switching element FET1 and the second switching element FET2 through resistors, to perform an ON/OFF control. In an ON state, as illustrated in FIG. 40, the first switching element FET2 may become conductive, while the first switching element FET1 may become non-conductive. In an OFF state, as illustrated in FIG. 41, the first switching element FET1 may become conductive, while the second switching element FET2 may become non-conductive.

FIG. 42 illustrates one example of a radio frequency module (a wireless communication apparatus). The radio frequency module (the wireless communication apparatus) 3 may be, for example, a mobile phone system that may have multiple functions such as sound, data communication, and LAN coupling. The radio frequency module 3 may include, for example, the antenna ANT, a radio frequency switch 2, a high power amplifier HPA, a radio frequency integrated circuit RFIC, a baseband unit BB, a sound output unit MIC, a data output unit DT, an interface I/F (for example, wireless LAN (W-LAN; Wireless Local Area Network), Bluetooth (registered trademark), and other communication methods). The radio frequency switch 2 may include the radio frequency switch 2 illustrated in FIGS. 33 to 39. The radio frequency integrated circuit RFIC and the baseband unit BB may be coupled through the interface I/F.

In the radio frequency module 3, during transmission, i.e., when the transmission signal is outputted to the antenna ANT from a transmission unit of the radio frequency module 3, the transmission signal outputted from the baseband unit BB may be outputted to the antenna ANT through the radio frequency integrated circuit RFIC, the high power amplifier HPA, and the radio frequency switch 2.

During reception, i.e., when the signal received by the antenna ANT is inputted to a reception unit of the radio frequency module 3, the reception signal may be inputted to the baseband unit BB through the radio frequency switch 2 and the radio frequency integrated circuit RFIC. The signal processed by the baseband unit BB may be outputted from output units such as the sound output unit MIC, the data output unit DT, and the interface I/F.

Although description has been made by giving the example embodiments as mentioned above, the contents of the disclosure are not limited to the above-mentioned example embodiments and may be modified in a variety of ways.

For example, in the forgoing first embodiment, description has been given on an example in which the thickness D5 of the LDD area A5 may be equal to the thickness D4 of the channel area A4. However, the thickness D5 of the LDD area A5 may not be equal to the thickness D4 of the channel area A4. The thickness D5 of the LDD area A5 may be equal to, for example, the thickness D3 of the source area R3S and the drain area R3D. In this case, in one preferred example, the shoulder S may be provided on a border between the channel area R4 and the LDD area R5S. In another alternative, the thickness D5 of the LDD area A5 may be an intermediate value between the thickness D4 of the channel area A4 and the thickness D3 of the source area R3S and the drain area R3D.

Moreover, for example, in the forgoing first embodiment, description has been given on an example in which the shoulder S may be provided on the border between the LDD area A5 and the source area R3S, and on the border between the LDD area A5 and the drain area R5D. However, a configuration that provides the difference between the thickness D4 of the channel area A4 or the thickness D5 of the LDD area A5 and the thickness D3 of the source area R3S and the drain area R3D is not limited to the shoulder S. The difference may be provided by any other configuration.

Furthermore, for example, in the forgoing example embodiments, description has been given on specific configurations of the semiconductor devices for radio frequency switch 1, and 1A to 1C, the radio frequency switch 2, and the radio frequency module 3. However, the semiconductor devices for radio frequency switch 1, and 1A to 1C, the radio frequency switch 2, and the radio frequency module 3 are not limited to those that include all the components as described. Also, some of the components may be substituted by another component or other components.

In addition, shapes, materials, and thicknesses, or deposition methods or other methods of the layers as described in the forgoing example embodiments are not limited to as exemplified above, but other shapes, materials, and thicknesses, or other deposition methods may be adopted.

Furthermore, for example, in the forgoing example embodiments, description has been given on a case in which the carrier substrate 11 of the SOI substrate 10 may be made of a highly resistive silicon substrate. However, the SOI substrate 10 may be a so-called SOS (Silicon On Sapphire) substrate including the carrier substrate 11 made of sapphire. Because the carrier substrate 11 made of sapphire has insulating properties, the semiconductor devices for radio frequency switch 1, and 1A to 1C formed on the SOS substrate may exhibit characteristic close to those of compound-based FETs such as GaAs-based FETs.

It is to be noted that effects described herein are merely exemplified and not limitative, and effects of the disclosure may be other effects or may further include other effects.

The contents of the technology may have the following configurations.

(1)

A semiconductor device for radio frequency switch, including:

an SOI substrate including a buried oxide film and a semiconductor layer on a carrier substrate; and a gate electrode provided on the semiconductor layer, wherein the semiconductor layer includes a first area below the gate electrode and a second area other than the first area, a third area is provided in at least part of the second area, and a fourth area is provided in at least part of the first area, the fourth area having a different thickness from a thickness of the third area.

(2)

The semiconductor device for radio frequency switch according to (1), wherein the thickness of the fourth area is smaller than the thickness of the third area.

(3)

The semiconductor device for radio frequency switch according to (1) or (2), wherein the third area serves as a source area and a drain area.

(4)

The semiconductor device for radio frequency switch according to (3), wherein the semiconductor layer further includes a fifth area between the fourth area and the source area, or between the fourth area and the drain area, the fifth area having a thickness equal to or substantially equal to the thickness of the third area.

(5)

The semiconductor device for radio frequency switch according to (4), wherein the semiconductor layer further includes a shoulder on a border between the fifth area and the source area, or on a border between the fifth area and the drain area.

(6)

The semiconductor device for radio frequency switch according to any one of (1) to (5), further including an interlayer insulating film on the gate electrode, wherein a low dielectric area is provided in the interlayer insulating film, the low dielectric area having a lower dielectric constant than a dielectric constant of the interlayer insulating film.

(7)

The semiconductor device for radio frequency switch according to (6), wherein the low dielectric area is provided above the fifth area.

(8)

The semiconductor device for radio frequency switch according to (6) or (7), wherein the low dielectric area is a cavity.

(9)

A semiconductor device for radio frequency switch, including:

an SOI substrate including a buried oxide film and a semiconductor layer on a carrier substrate; and a gate electrode that is provided on the semiconductor layer and extended in one direction, wherein the semiconductor layer includes a sixth area and a seventh area having a different thickness from a thickness of the sixth area, and the sixth area and the seventh area are arranged alternatively along a lengthwise direction of the gate electrode.

(10)

The semiconductor device for radio frequency switch according to (9), wherein the thickness of the seventh area is smaller than the thickness of the sixth area.

(11)

The semiconductor device for radio frequency switch according to (10), wherein the semiconductor layer further includes a shoulder on a border between the sixth area and the seventh area.

(12)

The semiconductor device for radio frequency switch according to any one of (9) to (11), further including an interlayer insulating film on the gate electrode, wherein a low dielectric area is provided in the interlayer insulating film, the low dielectric area having a lower dielectric constant than a dielectric constant of the interlayer insulating film.

(13)

The semiconductor device for radio frequency switch according to (12), wherein the low dielectric area is provided above the seventh area.

(14)

The semiconductor device for radio frequency switch according to (12) or (13), wherein the low dielectric area is a cavity.

(15)

A radio frequency switch provided with a switch region and a logic region, the switch region including a semiconductor device for radio frequency switch, and the logic region including a semiconductor device for logic, the semiconductor device for radio frequency switch including:

an SOI substrate including a buried oxide film and a semiconductor layer on a carrier substrate; and a first gate electrode provided on the semiconductor layer, wherein the semiconductor layer includes a first area below the first gate electrode and a second area other than the first area, a third area is provided in at least part of the second area, and a fourth area is provided in at least part of the first area, the fourth area having a different thickness from a thickness of the third area.

(16)

The radio frequency switch according to (15), wherein the semiconductor device for logic includes:

the SOI substrate; and a second gate electrode provided on the semiconductor layer, wherein the semiconductor layer includes the first area below the second gate electrode and the second area other than the first area, and a thickness of the first area is equal to a thickness of the second area.

(17)

A radio frequency switch provided with a switch region and a logic region, the switch region including a semiconductor device for radio frequency switch, and the logic region including a semiconductor device for logic, the semiconductor device for radio frequency switch including:

an SOI substrate including a buried oxide film and a semiconductor layer on a carrier substrate; and a gate electrode that is provided on the semiconductor layer and extended in one direction, wherein the semiconductor layer includes a sixth area and a seventh area having a different thickness from a thickness of the sixth area, and the sixth area and the seventh area are arranged alternatively along a lengthwise direction of the gate electrode.

(18)

The radio frequency switch according to (17), wherein the semiconductor device for logic includes:

the SOI substrate; and a second gate electrode provided on the semiconductor layer, wherein the semiconductor layer includes the first area below the second gate electrode and the second area other than the first area, and a thickness of the first area is equal to a thickness of the second area.

(19)

A radio frequency module provided with a radio frequency switch, the radio frequency switch including a switch region and a logic region, the switch region including a semiconductor device for radio frequency switch, and the logic region including a semiconductor device for logic, the semiconductor device for radio frequency switch including:
an SOI substrate including a buried oxide film and a semiconductor layer on a carrier substrate; and
a first gate electrode provided on the semiconductor layer,
wherein the semiconductor layer includes a first area below the first gate electrode and a second area other than the first area,
a third area is provided in at least part of the second area, and
a fourth area is provided in at least part of the first area, the fourth area having a different thickness from a thickness of the third area.

(20)
A radio frequency module provided with a radio frequency switch,
the radio frequency switch including a switch region and a logic region, the switch region including a semiconductor device for radio frequency switch, and the logic region including a semiconductor device for logic,
the semiconductor device for radio frequency switch including:
an SOI substrate including a buried oxide film and a semiconductor layer on a carrier substrate; and
a gate electrode that is provided on the semiconductor layer and extended in one direction,
wherein the semiconductor layer includes a sixth area and a seventh area having a different thickness from a thickness of the sixth area, and
the sixth area and the seventh area are arranged alternatively along a lengthwise direction of the gate electrode.

(21)
A method of manufacturing a semiconductor device for radio frequency switch, the method including:
forming a first area and a second area other than the first area in a semiconductor layer of an SOI substrate, the SOI substrate including a buried oxide film and the semiconductor layer on a carrier substrate, forming a third area in at least part of the second area, and forming a fourth area in at least part of the second area, the fourth area having a different thickness from a thickness of the third area; and
forming a gate electrode on the first area of the semiconductor layer.

(22)
A method of manufacturing a semiconductor device for radio frequency switch, the method including:
forming a sixth area and a seventh area having a different thickness from a thickness of the sixth area in a semiconductor layer of an SOI substrate, the SOI substrate including a buried oxide film and the semiconductor layer on a carrier substrate, and arranging the sixth area and the seventh area alternatively along one direction; and
forming a gate electrode on the semiconductor layer along the direction of the arrangement of the sixth area and the seventh area.

It should be understood by those skilled in the art that various modifications, combinations, sub-combinations and alterations may occur depending on design requirements and other factors insofar as they are within the scope of the appended claims or the equivalents thereof.

The invention claimed is:
1. A semiconductor device, comprising:
a Silicon On Insulator (SOI) substrate that includes:
a buried oxide film on a carrier substrate, and
a semiconductor layer on the buried oxide film;
a gate electrode on the semiconductor layer;
an interlayer insulating film on the gate electrode; and
a low dielectric area in the interlayer insulating film, wherein a dielectric constant of the low dielectric area is lower than a dielectric constant of the interlayer insulating film,
wherein the semiconductor layer includes:
a first area between the gate electrode and the buried oxide film, and
a second area different from the first area, wherein a thickness of the first area is different from a thickness of the second area.

2. The semiconductor device according to claim 1, wherein the thickness of the first area is smaller than the thickness of the second area.

3. The semiconductor device according to claim 1, wherein
the semiconductor layer further includes:
a third area adjacent to the second area, and
a fourth area in at least a part of the first area.

4. The semiconductor device according to claim 3, wherein the second area serves as a source area and a drain area.

5. The semiconductor device according to claim 4, wherein
the semiconductor layer further includes a fifth area at least one of between the fourth area and the source area, or between the fourth area and the drain area, and
the fifth area having a thickness substantially equal to the thickness of the fourth area.

6. The semiconductor device according to claim 5, wherein the semiconductor layer further includes a shoulder on at least one of a border between the fifth area and the source area, or a border between the fifth area and the drain area.

7. The semiconductor device according to claim 5, wherein the low dielectric area is above the fifth area, towards at least one of a source electrode or a drain electrode.

8. The semiconductor device according to claim 1, wherein the low dielectric area is a cavity.

9. A semiconductor device, comprising:
a Silicon On Insulator (SOI) substrate including:
a buried oxide film on a carrier substrate, and
a semiconductor layer on the buried oxide film;
a gate electrode on the semiconductor layer, wherein the gate electrode extends in one direction;
an interlayer insulating film on the gate electrode; and
a low dielectric area in the interlayer insulating film, wherein a dielectric constant of the low dielectric area is lower than a dielectric constant of the interlayer insulating film,
wherein, in a plan view of the one direction, the semiconductor layer includes a first area and a second area, wherein a thickness of the first area is different from a thickness of the second area.

10. The semiconductor device according to claim 9, wherein the first area is alternate to the second area along a lengthwise direction of the gate electrode.

11. The semiconductor device according to claim 9, wherein the thickness of the second area is smaller than the thickness of the first area.

12. The semiconductor device according to claim 9, wherein the semiconductor layer further includes a shoulder on a border between the first area and the second area.

13. The semiconductor device according to claim 9, wherein the low dielectric area is a cavity.

14. A semiconductor device, comprising:
a semiconductor layer;
  a gate electrode on the semiconductor layer;
  an interlayer insulating film on the gate electrode; and
  a low dielectric area in the interlayer insulating film, wherein a dielectric constant of the low dielectric area is lower than a dielectric constant of the interlayer insulating film,
wherein the semiconductor layer includes:
  a first area under the gate electrode;
  a second area different from the first area, wherein a thickness of the first area is different from a thickness of the second area.

15. The semiconductor device according to claim 14, wherein
the thickness of the first area is smaller than the thickness of the second area.

16. The semiconductor device according to claim 14, wherein
the semiconductor layer further includes:
a third area adjacent to the second area, and
  a fourth area in at least a part of the first area.

17. The semiconductor device according to claim 16, wherein the second area serves as a source area and a drain area.

18. The semiconductor device according to claim 17, wherein
the semiconductor layer further includes a fifth area at least one of between the fourth area and the source area, or between the fourth area and the drain area, and
the fifth area having a thickness substantially equal to the thickness of the fourth area.

19. The semiconductor device according to claim 18, wherein the semiconductor layer further includes a shoulder on at least one of a border between the fifth area and the source area, or a border between the fifth area and the drain area.

20. The semiconductor device according to claim 18, wherein the low dielectric area is above the fifth area, towards at least one of a source electrode or a drain electrode.

21. The semiconductor device according to claim 14, wherein the low dielectric area is a cavity.

* * * * *